United States Patent [19]
Hirano

[11] Patent Number: 6,084,579
[45] Date of Patent: Jul. 4, 2000

[54] DISPLAY APPARATUS USING ELECTROLUMINESCENCE ELEMENTS

[75] Inventor: Kiichi Hirano, Gifu-ken, Japan

[73] Assignee: Sanyo Electric Co., Ltd., Osaka, Japan

[21] Appl. No.: 08/978,262

[22] Filed: Nov. 25, 1997

[30] Foreign Application Priority Data

Nov. 29, 1996 [JP] Japan ................................ 8-320109
Sep. 30, 1997 [JP] Japan ................................ 9-267383

[51] Int. Cl.⁷ .............................. G09G 5/00; G09G 3/30; G09G 3/10
[52] U.S. Cl. ......................... 345/205; 345/76; 315/169.3
[58] Field of Search .............................. 345/76–81, 205; 313/498–512; 315/169.3

[56] References Cited

U.S. PATENT DOCUMENTS 4,042,854   8/1977   Luo et al. .................................. 345/76
4,633,141  12/1986   Weber ....................................... 345/211
5,828,181  10/1998   Okuda ........................................ 345/77

FOREIGN PATENT DOCUMENTS 5-74569   9/1991   Japan .
8-54835   2/1996   Japan .
8-54836   2/1996   Japan .

*Primary Examiner*—Mark R. Powell
*Assistant Examiner*—Anthony J. Blackman
*Attorney, Agent, or Firm*—Sheridan Ross P.C.

[57] ABSTRACT

A pixel of an organic electroluminescence (EL) display apparatus includes an EL element and an added capacitor connected in parallel with the EL element. The added capacitor provides improved image quality. To further improve image quality, an added resistor may be connected in series with the EL element, and in parallel with the added capacitor. Alternatively, the added resistor may be connected in series with the added capacitor, and in parallel with the EL element. The pixel may be used in both a simple matrix display system or an active matrix display system.

31 Claims, 17 Drawing Sheets

DISPLAY APPARATUS USING ELECTROLUMINESCENCE ELEMENTS

BACKGROUND OF THE INVENTION

The present invention relates generally to a display apparatus having an improved image quality. More particularly, the present invention relates to a display apparatus using electroluminescence elements.

Electroluminescence (EL) elements include an inorganic EL element which uses a thin film of an inorganic compound like selenium or zinc as a luminous material, and an organic EL element which uses an organic compound as a luminous material. The organic EL element preferably has the following features: (1) high luminous efficiency, (2) low drive voltage, (3) ability to display multifarious colors (green, red, blue, yellow, etc. by selection of a luminous material in use, (4) clear display and no need for a back light because it is of a self light emission type, (5) planar light emission and no dependency on the angle of visibility, (6) thin and light weight, and (7) low peak temperature in the fabrication process, which allows a soft material like a plastic film to be used for the substrate. Because of these properties, a display apparatus using such organic EL elements (organic EL display apparatus) has recently been getting attention as a replacement for a CRT or LCD.

An organic EL display apparatus can employ either a simple matrix system or an active matrix system. The simple matrix system allows an external drive unit to directly drive organic EL elements as a matrix of pixels, arranged on a display panel, in synchronism with a scan signal. Because the display panel of a display apparatus which employs this system is formed of organic EL elements, the drive time (duty) assigned to each pixel becomes shorter as the number of scan lines is increased, which lowers the contrast of an image displayed on the display panel.

The active matrix system has pixel driving element (active elements) provided respectively, for a matrix of pixels. Each pixel driving element serves as a switch which is switched on or off by the scan signal. When a pixel driving element is enabled, a data signal (display signal, video signal) is transmitted via that pixel driving element to an anode of the associated organic EL element and is written there. In this manner, the organic EL element is driven. When the pixel driving element is disabled, the data signal applied to the anode of the organic EL element is held as a charge in the organic EL element. The organic EL element is thus driven until the associated pixel driving element is switched on. The drive time per pixel becomes shorter as the number of scan lines is increased, therefore, the driving of the organic EL elements is not affected. As a result, the contrast is not lowered. In this respect, the active matrix system displays images with a higher quality than the simple matrix system.

The active matrix system employs transistor type (three-terminal type) pixel driving elements or diode type (two-terminal type) pixel driving elements. The transistor type is characterized as easily acquiring high contrast and high resolution, but is difficult to fabricate, as compared with the diode type. That is, the transistor type organic EL display apparatus provides high-quality images which match those displayed by a CRT. The operational principle of the active matrix system is mainly associated with the transistor type pixel driving elements.

Both the writing characteristic and the holding characteristic required of the individual pixels in the simple matrix system and active matrix system are important characteristics. The writing characteristic indicates whether or not a desired data signal can be written sufficiently in each organic EL element within a predetermined unit time conforming to the specifications of the display panel. The holding characteristic indicates whether or not a data signal, once written in each organic EL element, can be held for a predetermined time that conforms to the specifications of the display panel.

When multiple organic EL elements are arranged in a matrix, the size of the individual elements is structurally restricted and the electrostatic capacitance (hereinafter referred to as "capacitance") of the elements is limited. An organic EL element having a smaller capacitance has a lower holding characteristic, which makes it difficult to provide a display apparatus capable of displaying high-quality images.

Broadly speaking, the present invention is directed to a display apparatus using electroluminescence elements, which is capable of providing high-quality and stable display images. The present invention can be implemented in numerous ways, including as an apparatus and a method.

SUMMARY OF THE INVENTION

Briefly, the present invention is directed to a display apparatus comprising electroluminescence (EL) elements and added capacitors connected in parallel to the EL elements, respectively. The present invention is further directed to a display apparatus comprising a matrix of pixels, wherein each pixel includes an EL element and an added capacitor connected in parallel to the EL element.

The present invention further provides a display apparatus of a simple matrix system. The apparatus includes a matrix of pixels, each pixel including an electroluminescence element having a first electrode, a second electrode and a luminous element layer provided between the first electrode and the second electrode, an insulator film provided over one of the first electrode and the second electrode, and a third electrode provided in or over the insulator film so as to face one of the first electrode and the second electrode. The one of the first and second electrodes, the third electrode and the insulator film form an added capacitor. The added capacitor is connected in parallel to the electroluminescence element.

The present invention also provides a display apparatus of an active matrix system. The apparatus comprising a matrix of pixels and driving elements for driving the matrix of pixels, respectively. Each pixel including an electroluminescence element having a first electrode, a second electrode and a luminous element layer provided between the first electrode and the second electrode, an insulator film provided over one of the first electrode and the second electrode, a third electrode provided in or over the insulator film so as to face one of the first electrode and the second electrode. The one of the first and second electrodes, the third electrode and the insulator film forms an added capacitor. The added capacitor is connected in parallel to the electroluminescence element.

BRIEF DESCRIPTION OF THE DRAWINGS

The invention, together with objects and advantages thereof, may best be understood by reference to the following description of the presently preferred embodiments together with the accompanying drawings in which.

Figure 1:
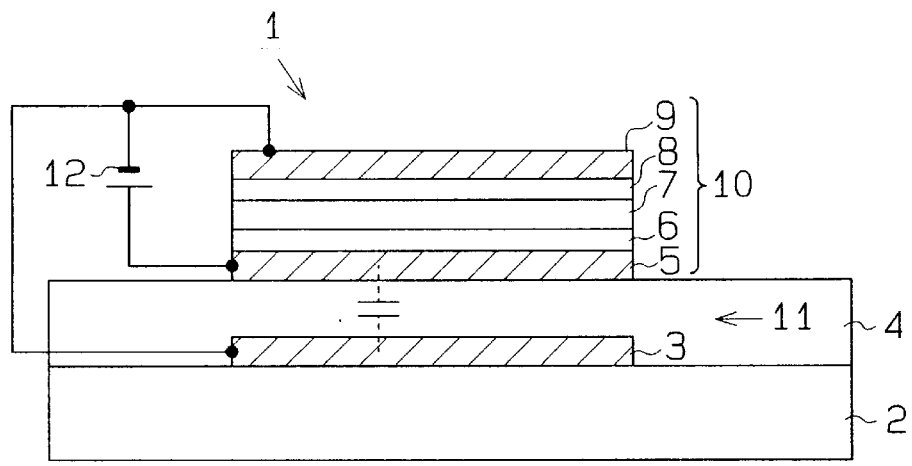
FIG. 1 is a schematic cross-sectional view of one pixel in a display apparatus according to a first embodiment of the present invention.

Other aspects and advantages of the invention will become apparent from the following description, taken in conjunction with the accompanying drawings, illustrating by way of example the principles of the invention.

DETAILED DESCRIPTION OF THE PREFERRED EMBODIMENTS

The present invention is directed to an organic EL display apparatus and to a pixel thereof. The invention may be used for a simple matrix display system and an active matrix display system, as discussed below. In the drawing, like numerals are used to reference like elements.

First Embodiment

An organic EL display apparatus according to a first embodiment of the present invention will now be described referring to the accompanying drawings. FIG. 1 is a schematic cross-sectional view of one pixel in an organic EL display apparatus using a simple matrix system according to the first embodiment. A pixel 1 includes an insulator substrate 2, an electrode 3 located on the insulator substrate 2, a transparent insulator film 4 provided on the insulator substrate 2 and the electrode 3, an anode 5 placed on the insulator film 4, a hole transporting layer 6 provided on the anode 5, a luminous layer 7 formed on the hole transporting layer 6, an electron transporting layer 8 formed on the luminous layer 7, and a cathode 9 provided on the electron transporting layer 8.

The transparent insulator substrate 2 is preferably a transparent insulator formed of glass or synthetic resin. The insulator film 4 is also preferably transparent and is preferably formed of silicon nitride, silicon oxide or silicon nitride oxide. The electrode 3 and anode 5 are preferably transparent electrodes formed of ITO (Indium Tin Oxide) or the like. The individual layers 6 to 8, which are preferably formed of organic compounds, form a luminous element layer. Further, the individual layers 6 to 8, the anode 5 and the cathode 9 form an organic EL element 10. The hole transporting layer 6 in the organic EL element 10 may be omitted in which case two layers of the luminous layer 7 and the electron transporting layer 8 form an organic compound layer. The hole transporting layer 6 comprises a first hole transporting layer and a second hole transporting layer. This structure provides the organic EL element 10 which has a very high luminous efficiency. That is, the luminance of the organic EL display apparatus is improved.

The color of light emitted by the organic EL element 10 can be changed by the selection of materials for the organic compound that forms the luminous layer 7. For example, Bebq2(10-benzo[h]quinolinol-beryllium complex) may used for the emission of green light, OXD (oxadiazole) or AZM (azomethine-zinc complex) may be used for the emission of blue light, PYR (pyrazoline) may be used for the emission of blue green light, Znq2(8-quinolinol-zinc complex) may be used for the emission of yellow light, and ZnPr(porphyrin-zinc complex) may be used for the emission of red light. The use of such organic EL elements which have different luminous colors provides a color display apparatus.

A passivation film (not shown) may be placed on the transparent insulator film 4 to cover the organic EL element 10. The pixels 1 are arranged in a matrix form to provide a display panel of the organic EL display apparatus.

The electrode 3 and anode 5 are arranged on both surfaces of the transparent insulator film 4 so that they face each other, with the transparent insulator film 4 in between. The transparent insulator film 4 serves as a dielectric film. The transparent insulator film 4, the electrode 3 and the anode 5 form a capacitor or added capacitor (auxiliary capacitor) 11.

The anode 5 serves as the first electrode of the added capacitor 11, while the electrode 3 serves as the second electrode of the added capacitor 11.

The anode 5 is electrically connected to the positive terminal of a drive power supply 12, and the electrode 3 and the cathode 9 are electrically connected to the negative terminal of the drive power supply 12. The organic EL element 10 and the added capacitor 11 are selectively connected in parallel to the drive power supply 12 via a switch (not shown).

In the organic EL element 10, holes (not shown) are injected into the luminous layer 7 from the anode 5, and electrons are injected into the luminous layer 7 from the cathode 9. Then, the holes are combined with the electrons in the luminous layer 7. As a result, light is emitted from the luminous layer 7. The emitted light is sent outside, passing through the anode 5, the transparent insulator film 4, the electrode 3 and the transparent insulator substrate 2. The hole transporting layer 6 facilitates the injection of holes from the anode 5 and block electrons from the cathode 9. The electron transporting layer 8 facilitates the injection of electrons from the cathode 9.

According to the first embodiment, since the organic EL element 10 and the added capacitor 11 are connected in parallel to the drive power supply 12, the holding characteristic of the pixel 1 is improved by the capacitance of the added capacitor 11. That is, the added capacitor 11 supplements the organic EL element 10 with capacitance. The organic EL element 10 and the added capacitor 11 can be used to implement an organic EL display apparatus of a simple matrix system which provides high-quality images.

Suppose that a silicon oxide film (a dielectric constant $\in$ of 3.8 and a specific dielectric constant $\in 0$ of $8.85 \times 10^{-14}$) is used for the transparent insulator film 4, the film thickness d of the transparent insulator film 4 between the electrode 3 and the anode 5 is set to 1000 Å, and the electrode 3, anode 5 and cathode 9 are formed into a rectangular shape with a size of $50 \times 150$ $\mu$m. In this case, the added capacitor 11 has a capacitance C of 2.5 pF. When the voltage of the drive power supply 12 is 6 V, a charge of 15 pC is stored in the added capacitor 11.

It is assumed that each pixel 1 is designed to maintain light emission for about 0.1 msec, according to a specification of the display panel. Then, a current I of 0.15 $\mu$A flows through the added capacitor 11 and the organic EL element 10. Therefore, a current of 2.0 mA/cm$^2$ per unit area flows through the anode 5 and the cathode 9 of the organic EL element 10. This current allows the pixel 1 or the organic EL element 10 to maintain a luminance of over 100 cd/m$^2$, even if the drive time (duty) assigned to each pixel decreases, such as about 60% of the drive time, as the number of scan lines is increased. The added capacitor 11 can therefore improve the holding characteristic of the pixel 1 and enable the pixel 1 to sufficiently hold the luminance for the required time.

Second Embodiment

A display apparatus according to a second embodiment of the present invention will now be described referring to the accompanying drawings.

Figure 2:
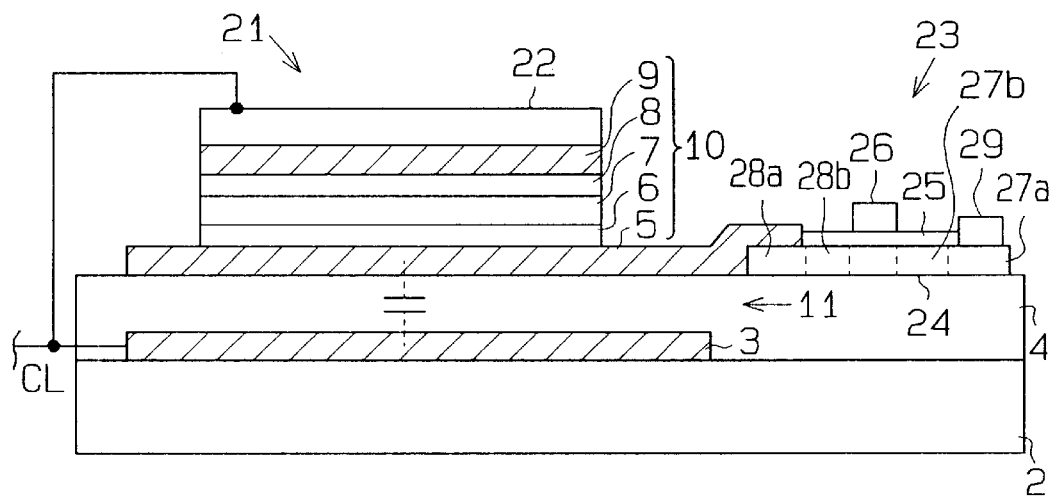
FIG. 2 is a schematic cross-sectional view of one if pixel in a display apparatus according to a second embodiment of the present invention.

FIG. 2 is a schematic cross-sectional view of one pixel 21 in an organic EL display apparatus of an active matrix system according to the second embodiment.

The pixel 21 includes an organic EL element 10, an added capacitor 11, and an added resistor 22. A thin film transistor (TFT) 23 is provided as a pixel driving element. A passivation film (not shown) is placed on a transparent insulator film 4 to cover the added resistor 22, the organic EL element 10 and the TFT 23.

It is preferable that the added resistor 22 comprises a high-resistance film formed on the cathode 9 of the organic EL element 10. An amorphous silicon film, polycide film or a silicide film may be used as the high-resistance film.

The TFT 23 is preferably a planar type, and is preferably formed into an LDD (Lightly Doped Drain) structure by using a polycrystalline silicon film 24 as an active layer. The TFT 23 may comprise a TFT having an SD (Single Drain) structure or a double gate structure. Further, the TFT 23 may further comprise a TFT of a reversed planar type, a staggered type or a reverse staggered type. A TFT which uses amorphous silicon film as an active layer may be used as well.

The polycrystalline silicon film 24 is located on the transparent insulator film 4. A gate insulator film 25 is provided on the polycrystalline silicon film 24, with a gate electrode 26 formed on the gate insulator film 25. Defined on the polycrystalline silicon film 24 are a high-density drain region 27a, a low-density drain region 27b, high-density source region 28a and a low-density source region 28b. A drain electrode 29 is provided on the high-density drain region 27a.

The anode 5 of the organic EL element 10 is formed to extend along the surface of the transparent insulator film 4 so that it is connected to the high-density source region 28a. The anode 5 thus serves as the source electrode of the TFT 23.

Figure 3:
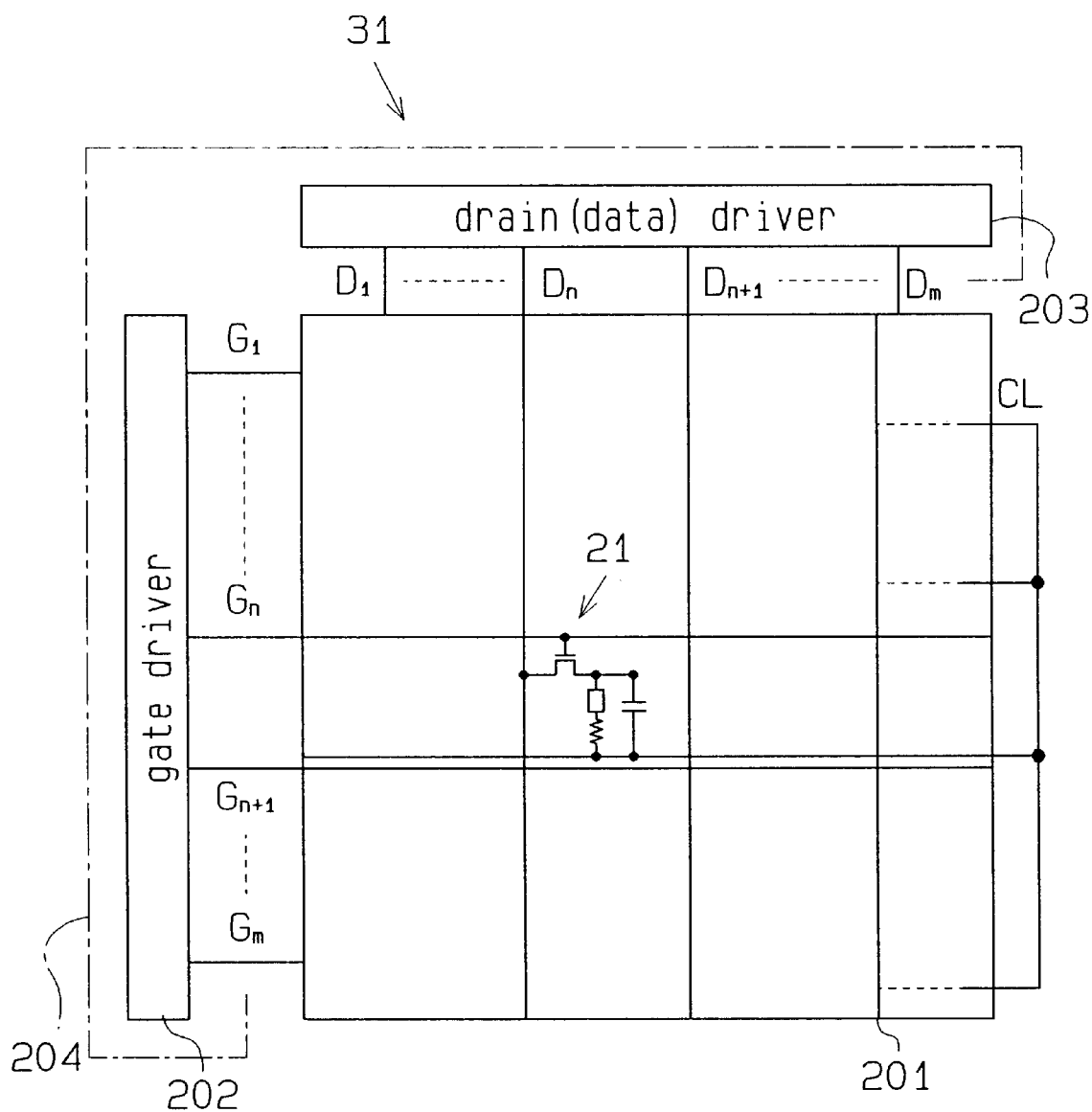
FIG. 3 schematically shows the display apparatus according to the second embodiment.

FIG. 3 is a schematic design of an organic EL display apparatus 31 according to the second embodiment. The organic EL display apparatus 31 includes a display panel 201, a gate driver 202, and a drain driver (data driver) 203.

The display panel 201 has a plurality of gate lines (scan lines) G1, . . . , Gn, Gn+1, . . . , and Gm, and a plurality of drain lines (data lines) D1, . . . , Dn, Dn+1, . . . , and Dm. The drain lines are preferably laid substantially perpendicular to the gate lines. Pixels 21 are provided at the intersections of the gate lines G1–Gm and the drain lines D1–Dm.

The gate driver 202 is connected to the gate lines G1–Gm and applies a gate signal (scan signal) to the gate lines G1–Gm. The drain driver 203 is connected to the drain lines D1–Dm and applies a data signal thereto. The drivers 202 and 203 form a peripheral drive circuit 204. Each of the gate lines G1–Gm is formed by the gate electrode 26 of the TFT 23. Each of the drain lines D1–Dm is formed by the drain electrode 29 of the TFT 23. In the TFT 23, the drain regions 27a and 27b may serve as a source region, the drain electrode 29 may serve as a source electrode, and the source regions 28a and 28b may serve as a drain region. In this case, the drain lines D1–Dm serve as source lines, while the drain driver 203 serves as a source driver.

Figure 4:
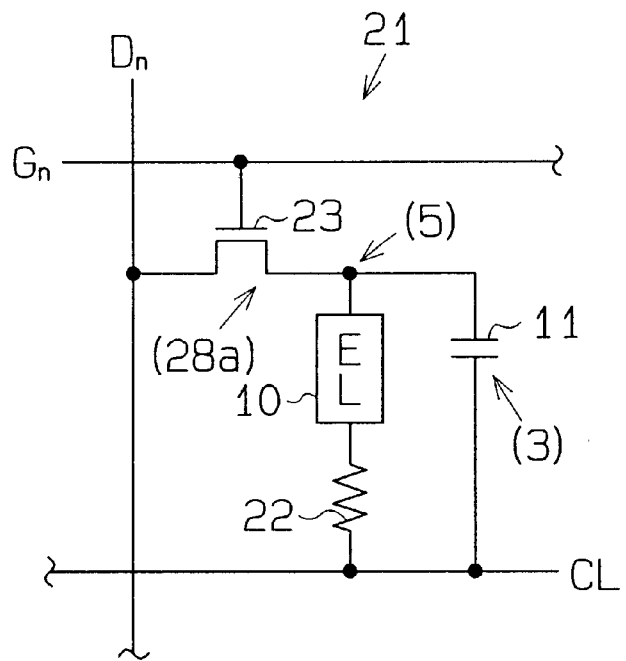
FIG. 4 is a schematic diagram showing an equivalent circuit of the pixel in FIG. 3.

FIG. 4 shows an equivalent circuit of the pixel 21 located at the intersection of the gate line Gn and the drain line Dn. The organic EL element 10 is connected to a common cathode line CL via the added resistor 22. The common cathode line CL, which is common to all of the pixels 21, is formed by the electrode 3 of the added capacitor 11. A substantially constant voltage is applied to the common cathode line CL.

The organic EL element 10 and the added resistor 22, connected in series to each other, and the added capacitor 11 are connected in parallel between the source region 28a of the TFT 23 and the common cathode line CL.

E According to the second embodiment, when a positive voltage is applied to the gate line Gn, thus applying a positive voltage to the gate electrode 26 of the TFT 23, the TFT 23 is turned on. Consequently, the electrostatic capacitor of the organic EL element 10 and the added capacitor 11 are charged with the data signal applied to the drain line Dn, causing the data signal to be written in the pixel 21. The organic EL element 10 is thus driven by data signal.

When a negative voltage is applied to the gate line Gn, thus applying a negative voltage to the gate electrode 26 of the TFT 23, the TFT 23 is turned off. Then, the electrostatic capacitor of the organic EL element 10 and the added capacitor 11 hold the data signal applied to the drain line Dn in the form of charges. In this manner, an arbitrary data signal is held in each pixel 21. The driving of the organic EL element 10 continues until the TFT 23 is turned on again.

According to the second embodiment, even if the drive time assigned to each pixel 21 becomes shorter with an increase in the number of gate lines (scan lines), the driving of the organic EL element 10 is not affected, which prevents the contrast of an image to be displayed on the display panel 201 from getting deteriorated. The organic EL display apparatus 31 of the active matrix system according to the second embodiment thus provides high-quality display images.

The series circuit of the organic EL element 10 and added resistor 22, and the added capacitor 11 are connected in parallel between the TFT 23 and the common cathode line CL, which allows the capacitance of the added capacitor 11 to improve the holding characteristic of each pixel 21. The organic EL display apparatus 31 may be used as an active matrix system which displays high-quality images.

The added resistor 22 is provided to supplement the internal resistance of organic EL element 10. If the organic EL element 10 has a small internal resistance and the added resistor 22 is not provided, a time constant of the internal resistance of the organic EL element 10 and the capacitance of the added capacitor 11 decreases. The decreased time constant shortens the data-signal holding time of the pixel 21, thus deteriorating the holding characteristic. The added resistor 22 is provided to overcome such a shortcoming. According to the second embodiment, assuming that the conditions for the transparent insulator film 4, the electrode 3, the anode 5 and the cathode 9 are set as in the first embodiment and the current I flowing through the added capacitor 11 is set to 0.15 $\mu$A, it is preferable to set the resistance of the added resistor 22 to about 40 M$\Omega$. The added resistor 22 may also be used with the pixel 1 of the first embodiment.

Since the pixel 21 in the second embodiment includes the TFT 23, the pixel 21 occupies a relatively large area on the display panel. The use of a TFT 23 having a relatively small transistor size can avoid an increase in the area of the TFT 23 as much as possible, while sufficiently driving the pixel 21. Suppose that the width (gate width W) and the length (gate length) of the gate electrode 26 of the TFT 23 are both set to about 5 $\mu$m. Then, a current of about 10 to about 20 $\mu$A flows between the source and drain. This current value is sufficiently larger than the value of the current I (0.15 $\mu$A) that flows through the added capacitor 11 and the organic EL element 10, which permits the use of the TFT 23 having a small transistor size.

The TFT 23 of the LDD structure, which uses the polycrystalline silicon film 24 as an active layer, has a large ON/OFF ratio and permits a small leak current to flow when it is off. This can ensure the display of a high-quality image.

Third Embodiment

A display apparatus according to a third embodiment of the present invention will be described below with reference to the accompanying drawings.

Figure 5:
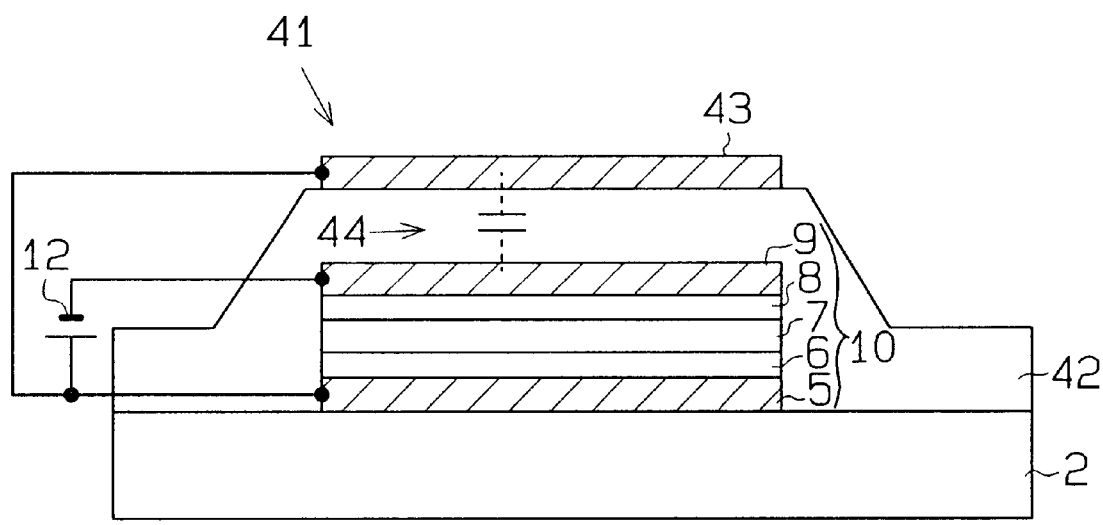
FIG. 5 is a schematic cross-sectional view of one pixel in a display apparatus according to a third embodiment of the present invention.

FIG. 5 is a schematic cross-sectional view of one pixel 41 in an organic EL display apparatus of a simple matrix system according to the third embodiment. The pixel 41 includes a transparent insulator substrate 2, an anode 5, a hole transporting layer 6, a luminous layer 7, an electron transporting layer 8, a cathode 9, an insulator film 42, and an electrode 43. The individual components 5 to 9, 42 and 43 are laminated on the transparent insulator substrate 2 in the order shown in FIG. 5.

The insulator film 42 is preferably formed of silicon nitride, silicon oxide or silicon nitride oxide. The insulator film 42 need not be transparent, and may be formed using known insulative materials which have the desired insulation property.

The electrode 43 is preferably formed of an aluminum alloy film, a high-melting-point metal film, a high-melting-point metal compound film, a silicide film, a polycide film or a doped polysilicon film. The electrode 43 need not be transparent, and may be formed of a film which has a low resistance.

The electrode 43 and the cathode 9 are arranged to face each other with the insulator film 42 in between. The insulator film 42 serves as a dielectric film. The insulator film 42, the electrode 43 and the cathode 9 form a capacitor or an added capacitor 44. The cathode 9 serves as the first electrode of the added capacitor 44, while the electrode 43 serves as the second electrode of the added capacitor 44.

The electrode 43 and the anode 5 are connected to the positive terminal of a drive power supply 12, and the cathode 9 to the negative terminal of the drive power supply 12. Thus, the organic EL element 10 and the added capacitor 44 are selectively connected in parallel to the drive power supply 12 via a switch (not shown).

As the organic EL element 10 and the added capacitor 44 are connected in parallel to the drive power supply 12 according to the third embodiment, the holding characteristic of the pixel 41 is improved by the capacitance of the added capacitor 44. That is, the added capacitor 44 supplements the organic EL element 10 with the capacitance. The pixel 41 may be used to implement a high image-quality organic EL display apparatus.

Fourth Embodiment

Figure 6:
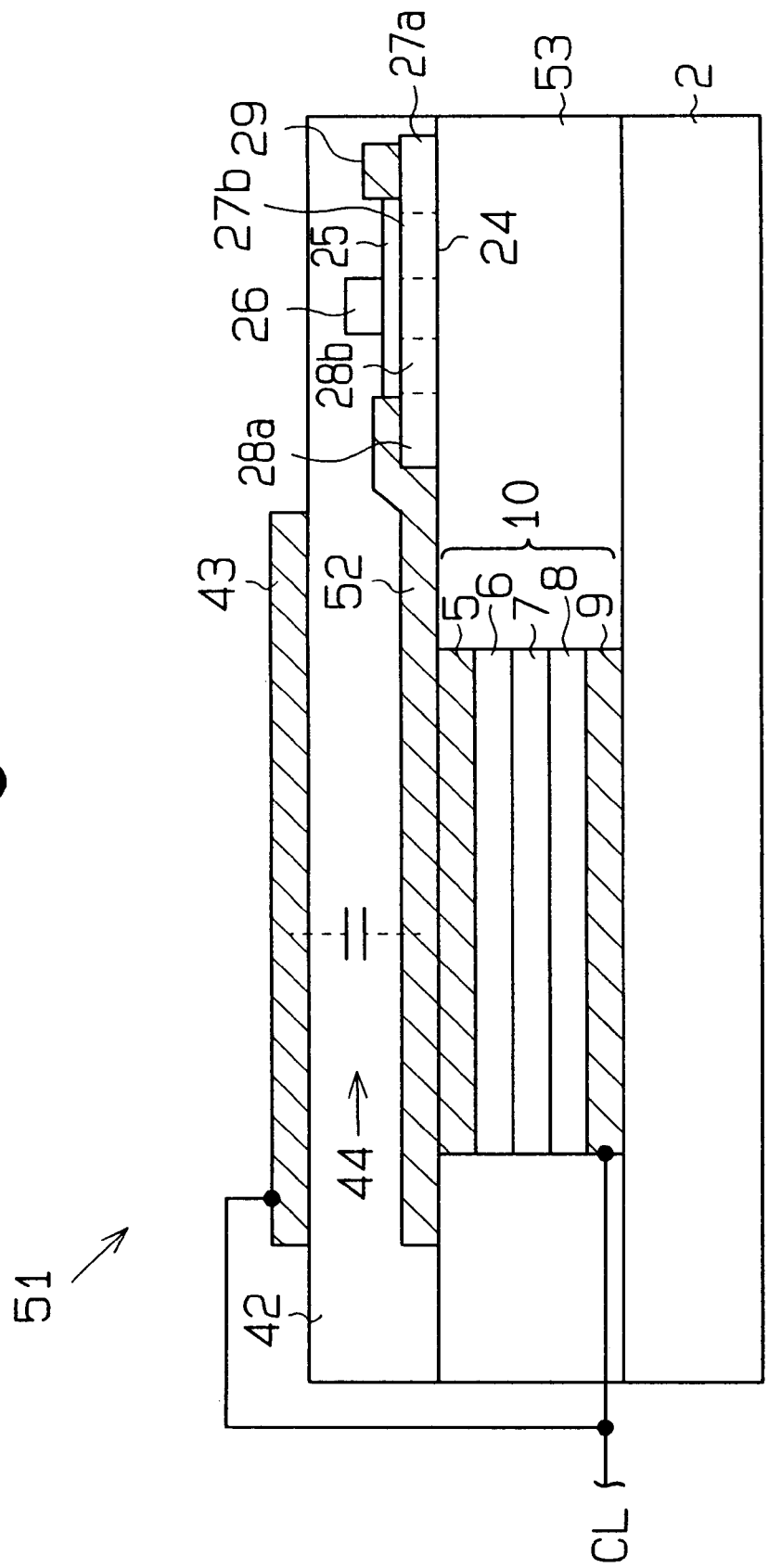
FIG. 6 is a schematic cross-sectional view of one pixel in a display apparatus according to a fourth embodiment of the present invention.

A display apparatus according to a fourth embodiment of the present invention will be described below with reference to the accompanying drawings. To avoid a redundant description, like or same reference numerals are given to those components that are like or the same as the corresponding components of the first to third embodiments. FIG. 6 is a schematic cross-sectional view of one pixel 51 in an organic EL display apparatus of an active matrix system.

The pixel 51 includes an organic EL element 10, an added capacitor 44 and an electrode 52. A TFT 23 is provided as a pixel driving element. Provided on a transparent insulator substrate 2 are the organic EL element 10 and an insulator film 53 whose surfaces are flattened. That is, the insulator film 53 eliminates a step formed on the transparent insulator substrate 2 by the organic EL element 10. The insulator film 53 is preferably formed of silicon nitride, silicon oxide or silicon nitrogen oxide. The insulator film 53 need not be transparent, and may be formed of a material which has a predetermined desired insulation property.

The organic EL element 10 comprises a cathode 9, an electron transporting layer 8, a luminous layer 7, a hole transporting layer 6 and an anode 5 as an added resistor, which are laminated on the transparent insulator substrate 2 in the named order. The anode 5 is preferably formed of a high-resistance film which is preferably a polycide film or a silicide film.

The electrode 52 is located on the anode 5 of the organic EL element 10. The electrode 52 is formed to extend along a surface of the insulator film 53, and is connected to a high-density source region, 28a, of the TFT 23. The electrode 52 thus serves as the source electrode of the TFT 23.

Provided on the electrode 52 is an insulator film 42 on which an electrode 43 is located. The electrodes 52 and 43 are arranged to face each other with the insulator film 42 in between. The insulator film 42 serves as a dielectric film. The insulator film 42, the electrode 52 and the electrode 43 form a capacitor or an added capacitor 44. The electrode 52 serves as the first electrode of the added capacitor 44, and the electrode 43 serves as the second electrode of the added capacitor 44. As the added capacitor 44 and the anode 5 are connected together, the anode 5 and the electrode 52 also serve as the first electrode of the added capacitor 44.

Figure 7:
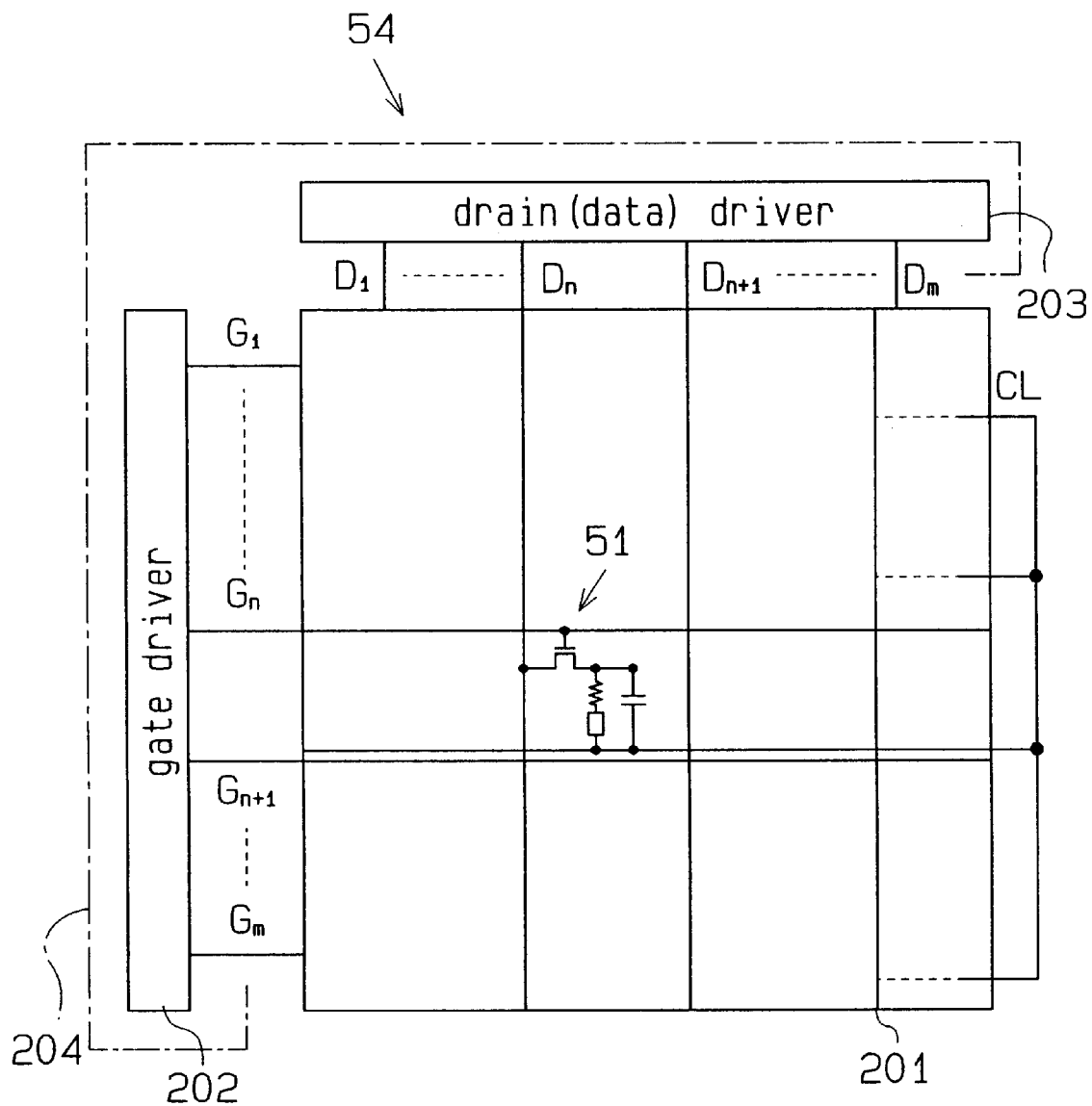
FIG. 7 schematically shows the display apparatus according to the fourth embodiment.
Figure 8:
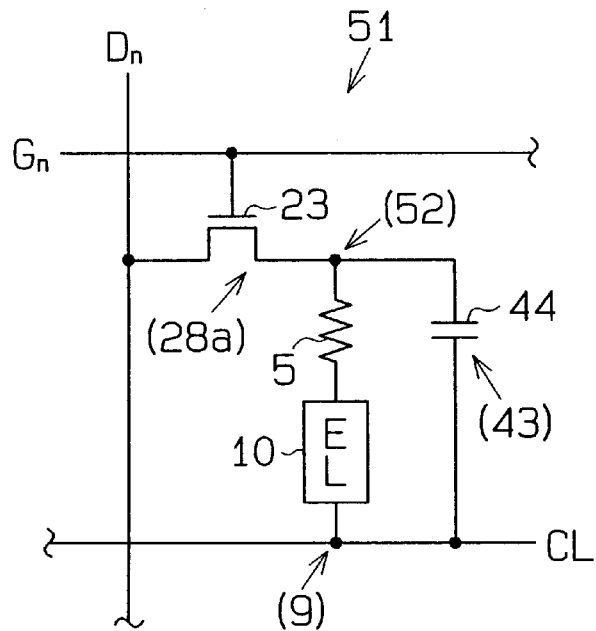
FIG. 8 is a schematic diagram showing an equivalent circuit of the pixel in FIG. 7.

FIG. 7 is a schematic diagram of an organic EL display apparatus 54 according to the fourth embodiment. The organic EL display apparatus 54 includes a display panel 201, a gate driver 202, and a drain driver 203. FIG. 8 shows an equivalent circuit of the pixel 51 located at the intersection of the gate line Gn and the drain line Dn. The organic EL element 10 is connected to a common cathode line CL. The common cathode line CL, which is common to all of the pixels 51, is formed by the cathode 9 of the organic EL element 10. Therefore, the series circuit of the organic EL element 10 and the anode 5, and the added capacitor 44 are connected in parallel between the high-density source region 28a and the common cathode line CL.

The fourth embodiment uses the TFTs 23, as per the second embodiment, to prevent the contrast from being degraded and to ensure a high-quality display image. The series circuit of the organic EL element 10 and anode 5, and the added capacitor 44 are connected in parallel between the TFT 23 and the common cathode line CL. This circuit permits the holding characteristic of each pixel 51 to be improved by the capacitance of the added capacitor 44. The implemented organic EL display apparatus 54 of an active matrix system can display high-quality images.

Fifth Embodiment

A display apparatus according to a fifth embodiment of the present invention will now be described with reference to the accompanying drawings.

Figure 9:
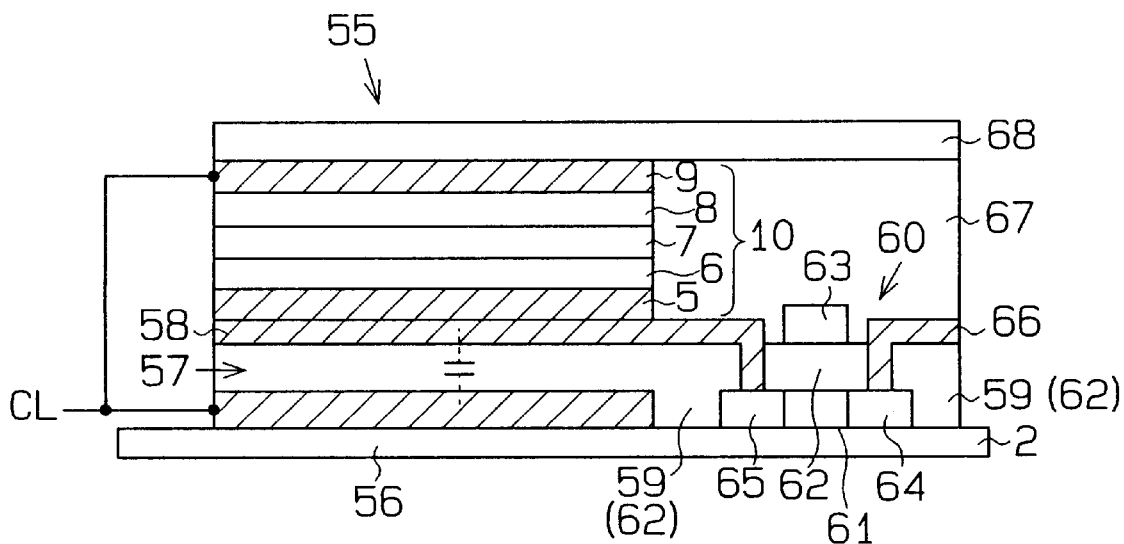
FIG. 9 is a schematic cross-sectional view of one pixel in a display apparatus according to a fifth embodiment of the present invention.

FIG. 9 is a schematic cross-sectional view of one pixel 55 in an organic EL display apparatus of an active matrix system according to the fifth embodiment. The pixel 55 includes an organic EL element 10, an added capacitor 57 and an added resistor 58. A TFT 60 is provided as a pixel driving element.

An electrode 56, a transparent insulator film 59, the added resistor 58 and the organic EL element 10 are preferably laminated on a transparent insulator substrate 2 in the named order. The transparent insulator film 59 is preferably formed of silicon nitride, silicon oxide or silicon nitride oxide. The electrode 56 and the added resistor 58 are preferably transparent electrodes formed of ITO (Indium Tin Oxide) or the like. The electrode 56 serves as the first electrode of the added capacitor (auxiliary capacitor) 57. It is preferable that the added resistor 58 is a high-resistance film formed of amorphous silicon, polycide or silicide.

The electrode 56 and the added resistor 58 face each other with the transparent insulator film 59 located in between. The transparent insulator film 59 thus serves as a dielectric film. Further, the transparent insulator film 59, the electrode 56 and the added resistor 58 form a capacitor or the added capacitor 57.

The TFT 60 is preferably a planar type which has an active layer which is comprised of a polycrystalline silicon film 61 (or amorphous silicon film). The polycrystalline silicon film 61 is provided on the transparent insulator substrate 2. Formed on the polycrystalline silicon film 61 is a gate insulator film 62 on which a gate electrode 63 is provided. A drain region 64 and a source region 65 are defined on the polycrystalline silicon film 61. The drain region 64 is connected to a drain electrode 66. In the TFT 60, the drain region 64 may serve as a source region, the drain electrode 66 may serve as a source electrode, and the source region 65 may serve as a drain region.

The added resistor 58 preferably extends along a surface of the transparent insulator film 59 and is connected to the source region 65 of the TFT 60. The anode 5 of the organic EL element 10 serves as the source electrode of the TFT 60. An insulator film 67 is formed on the TFT 60 to eliminate the step of the organic EL element 10. A passivation film 68 is formed on the organic EL element 10 and the insulator film 67.

Figure 10:
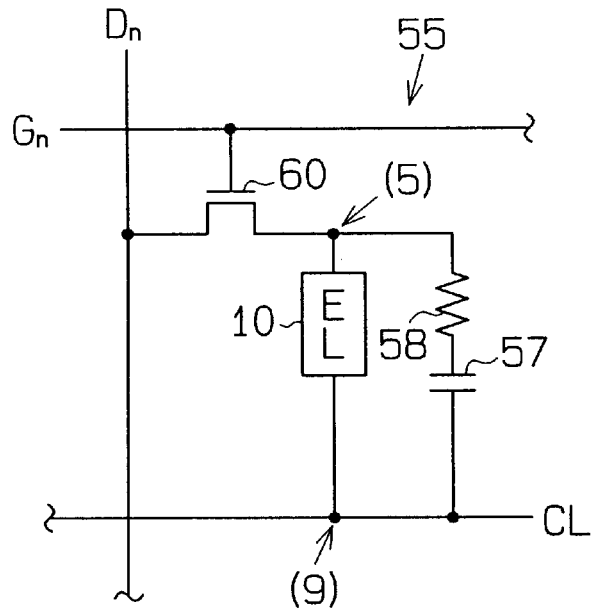
FIG. 10 is a schematic diagram showing an equivalent circuit of the pixel in FIG. 9.

FIG. 10 is an equivalent circuit diagram of the pixel 55. The organic EL element 10 is connected between the drain line (positive terminal of the drive power supply) Dn and a common cathode line CL via the TFT 60. The added resistor 58 is connected via the added capacitor 57 to the common cathode line CL. That is, the series circuit of the added resistor 58 and added capacitor 57, and the organic EL element 10 are connected in parallel between the source region 65 of the TFT 60 and the common cathode line CL. Therefore, the holding characteristic of each pixel 55 is improved by the capacitance of the added capacitor 57. The pixel 55 may be used to implement an organic EL display apparatus of an active matrix system which displays high-quality images. The organic EL display apparatus of an active matrix system according to the fifth embodiment, like the second embodiment, uses the TFTs 60 and is thus able to display high-quality images. Further, the added resistor 58 is provided in parallel to the organic EL element 10 in the fifth embodiment. This particular arrangement of the added resistor 58 prevents a writing characteristic of the pixel 55 from being degraded by the added resistor 58.

Sixth Embodiment

Figure 11:
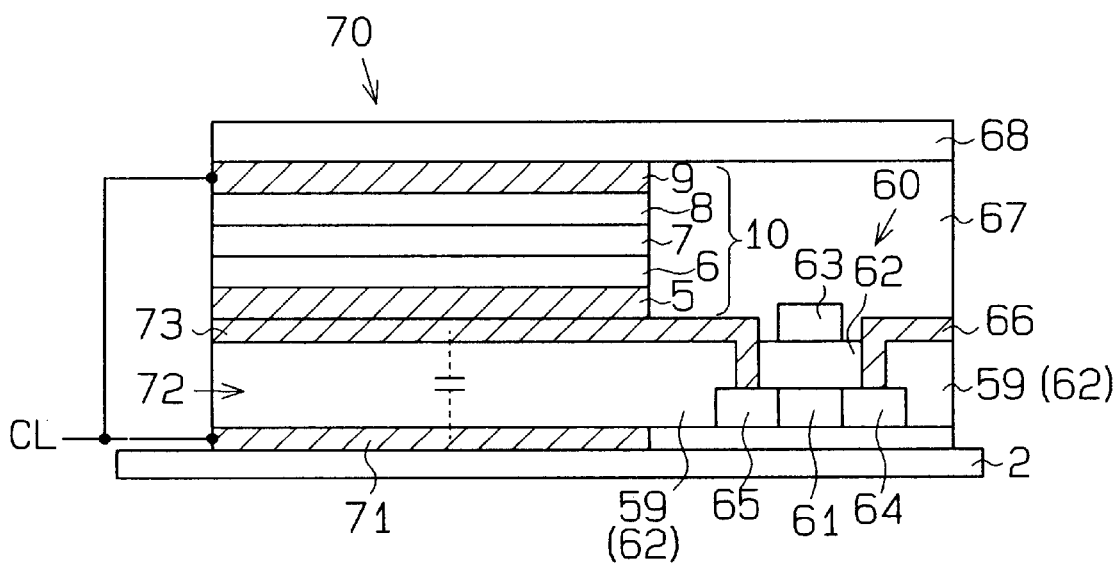
FIG. 11 is a schematic cross-sectional view of one pixel in a display apparatus according to a sixth embodiment of the present invention.

A display apparatus according to a sixth embodiment of the present invention will now be described with reference to the accompanying drawings. FIG. 11 is a schematic cross-sectional view of one pixel 70 in an organic EL display apparatus of an active matrix system according to the sixth embodiment.

The pixel 70 includes an organic EL element 10 and an added capacitor 72. A TFT 60 is provided as a pixel driving element. An electrode 71, a transparent insulator film 59, an electrode 73 and the organic EL element 10 are preferably laminated on a transparent insulator substrate 2 in the named order. The electrode 71 functions as an added resistor. It is preferable that the electrode 71 is a high-resistance film formed of an amorphous silicon, polycide or silicide. The electrode 71 also serves as the first electrode of the added capacitor (auxiliary capacitor) 72, and the electrode 73 as the second electrode of the added capacitor 72.

The electrodes 71 and 73 face each other with the transparent insulator film 59 located in between. The transparent insulator film 59 thus serves as a dielectric film. The transparent insulator film 59, the electrode 71 and the electrode 73 form a capacitor or the added capacitor 72.

The electrode 73 preferably extends along the surface of the transparent insulator film 59 and is connected to the source region 65 of the TFT 60. That is, the anode 5 of the organic EL element 10 serves as the source electrode of the TFT 60.

Figure 12:
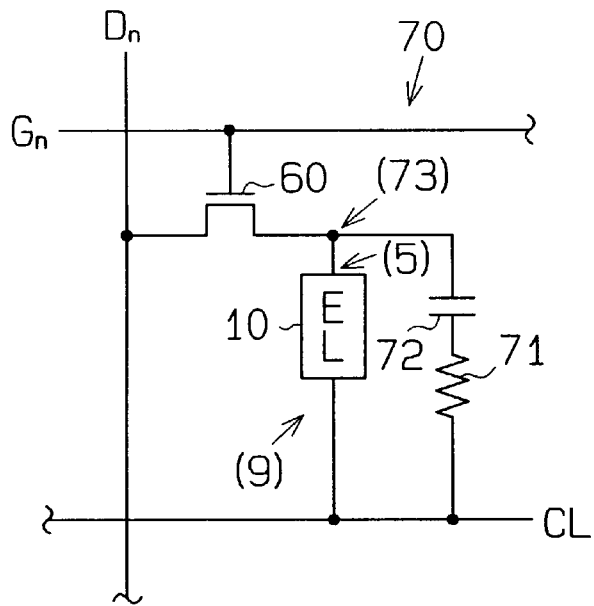
FIG. 12 is a schematic diagram showing an equivalent circuit of the pixel in FIG. 11.

FIG. 12 is an equivalent circuit diagram of the pixel 70. The organic EL element 10 is connected between the drain line (positive terminal of the drive power supply) Dn and a common cathode line CL via the TFT 60. The electrode (added resistor) 71 is connected between the added capacitor 72 and the common cathode line CL. The series circuit of the added capacitor 72 and the added resistor 71, and the organic EL element 10 are connected in parallel between the source region 65 of the TFT 60 and the common cathode line CL. Therefore, the holding characteristic of the pixel 70 is improved by the capacitance of the added capacitor 72. The pixel 70 may be used to implement an organic EL display apparatus of an active matrix system which displays high-quality images. The parallel arrangement of the electrode 71 as an added resistor and the organic EL element 10 prevents the writing characteristic from being degraded by the electrode 71. Further, the organic EL display apparatus according to the sixth embodiment ensures a high-quality display by using the TFTs 60, as per the second embodiment.

Seventh Embodiment

Figure 13:
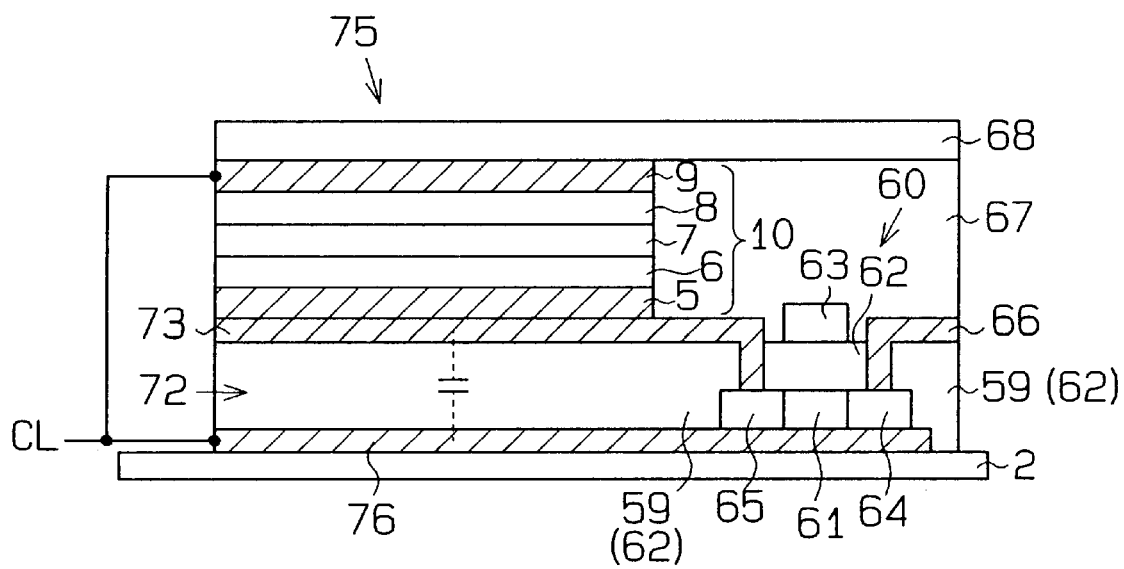
FIG. 13 is a schematic cross-sectional view of one pixel in a display apparatus according to a seventh embodiment of the present invention.

A display apparatus according to a seventh embodiment of the present invention will be described below with reference to the accompanying drawings. FIG. 13 is a schematic cross-sectional view of one pixel 75 in an organic EL display apparatus of an active matrix system according to the seventh embodiment.

Each pixel 75 includes an organic EL element 10 and an added capacitor 72. A TFT 60 is provided as a pixel driving element. An electrode 76, which is the first electrode of the added capacitor (auxiliary capacitor) 72, serves as an added resistor, and preferably extends below the TFT 60 in order to block the influence of ions, such as sodium ions or potassium ions, contained in glass, on the TFT 60 when low quality glass containing such ions is used for a transparent insulator substrate 2. Thus, the pixel 75 operates stably, which improves the reliability of the pixel 75. The remaining structure of the pixel 75 is the same as that of the pixel 70 of the sixth embodiment (see FIG. 11).

Eighth Embodiment

Figure 14:
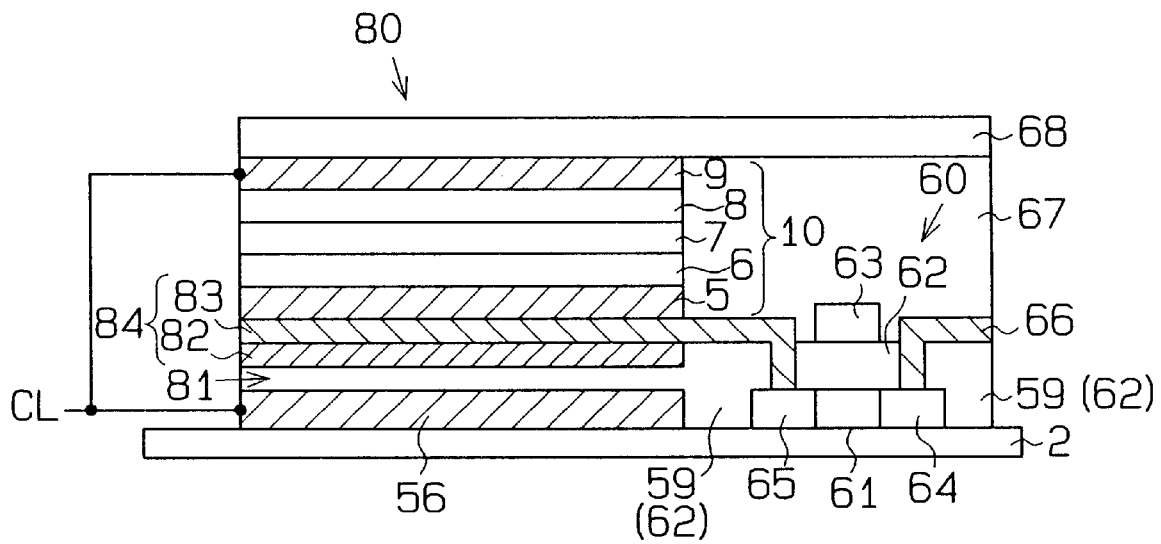
FIG. 14 is a schematic cross-sectional view of one pixel in a display apparatus according to an eighth embodiment of the present invention.

A display apparatus according to an eighth embodiment of the present invention will now be described with reference to the accompanying drawings. FIG. 14 is a schematic cross-sectional view of one pixel 80 in an organic EL display apparatus of an active matrix system according to the eighth embodiment.

The pixel 80 includes an organic EL element 10, an added capacitor 81 and an added resistor 84. A TFT 60 is provided as a pixel driving element. An electrode 56, a transparent insulator film 59, the added resistor 84 and the organic EL element 10 are preferably laminated on a transparent insulator substrate 2 in the named order. The electrode 56 serves as the first electrode of the added capacitor (auxiliary capacitor) 81.

The added resistor 84 preferably comprises an $N^+$ type polycrystalline silicon film 82 located on the transparent insulator film 59, and a $P^+$ type polycrystalline silicon film 83 located on the silicon film 82. Therefore, the added resistor 84 operates as a variable resistor with a PN junction structure. When a current flows in the forward direction to the $N^+$ type polycrystalline silicon film 82 from the $P^+$ type polycrystalline silicon film 83, the added resistor 84 serves as a low-resistance resistor. When a current flows in the reverse direction to the $P^+$ type polycrystalline silicon film 83 from the $N^+$ type polycrystalline silicon film 82, the added resistor 84 serves as a high-resistance resistor.

The electrode 56 and the added resistor 84 face each other with the transparent insulator film 59 located therebetween. The transparent insulator film 59 thus serves as a dielectric film. The transparent insulator film 59, the electrode 56 and the added resistor 84 form a capacitor or the added capacitor 81.

The $P^+$ type polycrystalline silicon film 83 extends along the surface of the transparent insulator film 59 and is connected to the source region 65 of the TFT 60. Since, the anode 5 of the organic EL element 10 is in contact with the $P^+$ type silicon film 83, the anode 5 serves as the source electrode of the TFT 60.

Figure 15:
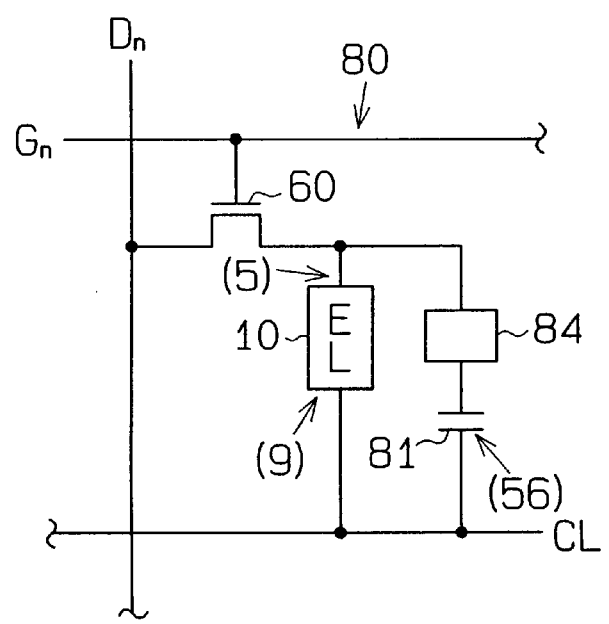
FIG. 15 is a schematic diagram showing an equivalent circuit of the pixel in FIG. 14.

FIG. 15 is equivalent circuit diagram of the pixel 80. The organic EL element 10 is connected between the drain line (positive terminal of the drive power supply) Dn and a common cathode line CL via the TFT 60. The added resistor 84 is connected by way of the added capacitor 81 to the common cathode line CL. Therefore, the series circuit of the added resistor 84 and added capacitor 81, and the organic EL element 10 are connected in parallel between the source region 65 of the TFT 60 and the common cathode line CL.

According to the eighth embodiment, when a positive voltage is applied to the gate line Gn, thus applying a positive voltage to the gate electrode 63 of the TFT 60, the TFT 60 is turned on. Consequently, the electrostatic capacitance of the organic EL element 10 and the added capacitor 81 are charged with the data signal applied to the drain line Dn, causing the data signal to be written in the pixel 80. The organic EL element 10 is driven by the data signal. At this time, the added resistor 84 serves as a low-resistance resistor, so that the current flows in the forward direction to the $N^+$ type polycrystalline silicon film 82 from the $P^+$ type polycrystalline silicon film 83, quickly charging the added capacitor 81.

When a negative voltage is applied to the gate line Gn, thus applying a negative voltage to the gate electrode 63 of the TFT 60, the TFT 60 is turned off. Then, the data signal applied to the drain line Dn is held in the form of charges by the electrostatic capacitance of the organic EL element 10 and the added capacitor 81. In accordance with the light emission from the organic EL element 10, the current flows to the organic EL element 10 from the added capacitor 81. At this time, the added resistor 84 function as a high-resistance resistor, so that the current flows in the reverse direction to the $P^+$ type polycrystalline silicon film 83 from the $N^+$ type polycrystalline silicon film 82, slowly discharging the added capacitor 81. The organic EL element 10 is kept driven until the TFT 60 is turned on again.

According to the eighth embodiment, when a data signal is written, the added resistor 84 serves as a low-resistance resistor, making the time constant smaller, so that the added capacitor 81 is charged promptly. When a data signal is held, the added resistor 84 serves as a high-resistance resistor, increasing the time constant, which causes the added capacitor 81 to be discharged slowly. Even if the drive time assigned to a single pixel 80 becomes shorter with an increase in the number of gate lines (scan lines), the added capacitor 81 is sufficiently charged. Such a charging and discharging operation reduces the influence on the drive of the organic EL element 10 and prevents the contrast of a display image on the display panel decreasing. Thus, the pixel 80 may be used to implement an organic EL display apparatus of an active matrix system which displays high-quality images.

Ninth Embodiment

Figure 16:
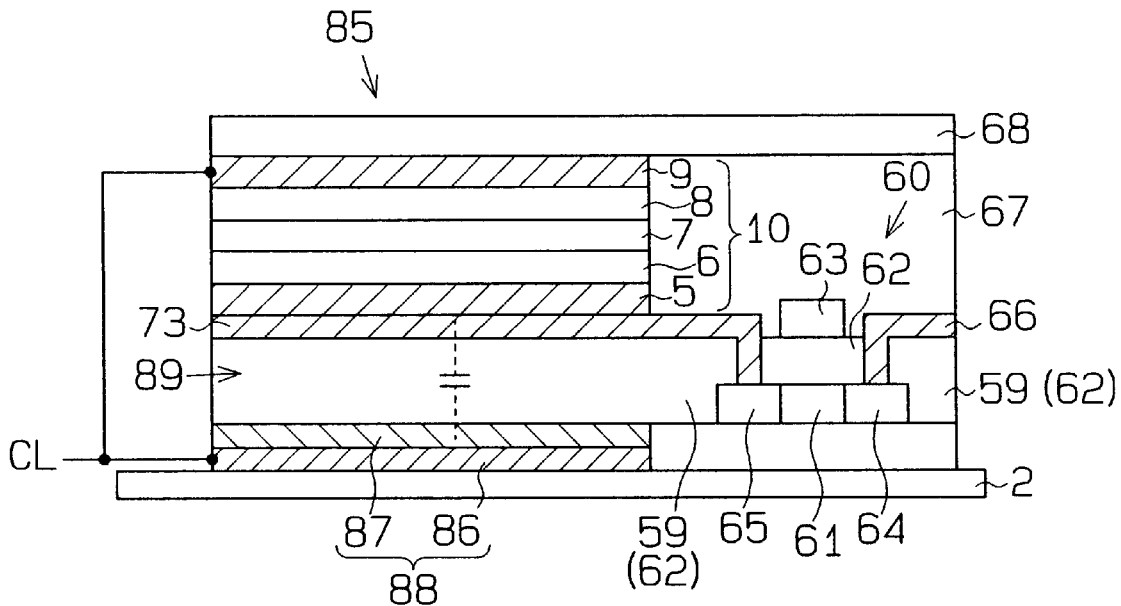
FIG. 16 is a schematic cross-sectional view of one pixel in a display apparatus according to a ninth embodiment of the present invention.

A display apparatus according to a ninth embodiment of the invention will now be described with reference to the accompanying drawings. FIG. 16 is a schematic cross-sectional view of one pixel 85 in an organic EL display apparatus of an active matrix system according to the ninth embodiment. The pixel 85 includes an organic EL element 10, an added resistor 88 and an added capacitor 89. A TFT 60 is provided as a pixel driving element. The added resistor 88, a transparent insulator film 59, an electrode 73, and the organic EL element 10 are preferably laminated on a transparent insulator substrate 2 in the named order. The added resistor 88 serves as the first electrode of the added capacitor (auxiliary capacitor) 89, and the electrode 73 serves as the second electrode of the added capacitor 89.

The added resistor 88 comprises an $N^+$ type polycrystalline silicon film 86 located on the transparent insulator substrate 2, and a $P^+$ type polycrystalline silicon film 87 located on the silicon film 86. The added resistor 88 operates as a variable resistor with a PN junction structure.

The electrode 73 and the added resistor 88 face each other with the transparent insulator film 59 located therebetween. The transparent insulator film 59 thus serves as a dielectric film. The transparent insulator film 59, the electrode 73 and the added resistor 88 form a capacitor or the added capacitor 89.

Figure 17:
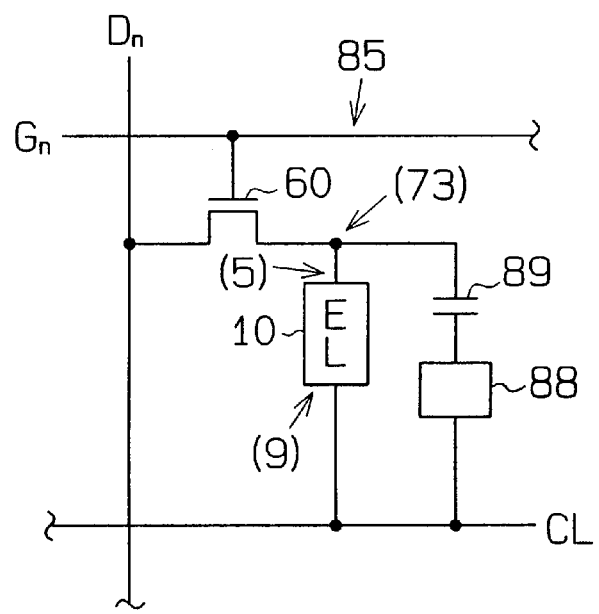
FIG. 17 is a diagram showing an equivalent circuit of the pixel in FIG. 16.

FIG. 17 is an equivalent circuit design of the pixel 85. The organic EL element 10 is connected between the drain line (positive terminal of the drive power supply) Dn and a common cathode line CL via the TFT 60. The added resistor 88 is connected between the added capacitor 89 and the common cathode line CL. That is, the series circuit of the added capacitor 89 and the added resistor 88, and the organic EL element 10 are connected in parallel between the source region 65 of the TFT 60 and the common cathode line CL. The holding characteristic of the pixel 85 is improved by the capacitance of the added capacitor 89. The pixel 85 may be used to implement a high-image-quality, organic EL display apparatus of an active matrix system. The use of the added resistor 88, which serves as a variable resistor, further improves the holding characteristic of the pixel 85 as per the eighth embodiment, which realizes an organic EL display apparatus of an active matrix system which displays images with a high quality.

Tenth Embodiment

Figure 18:
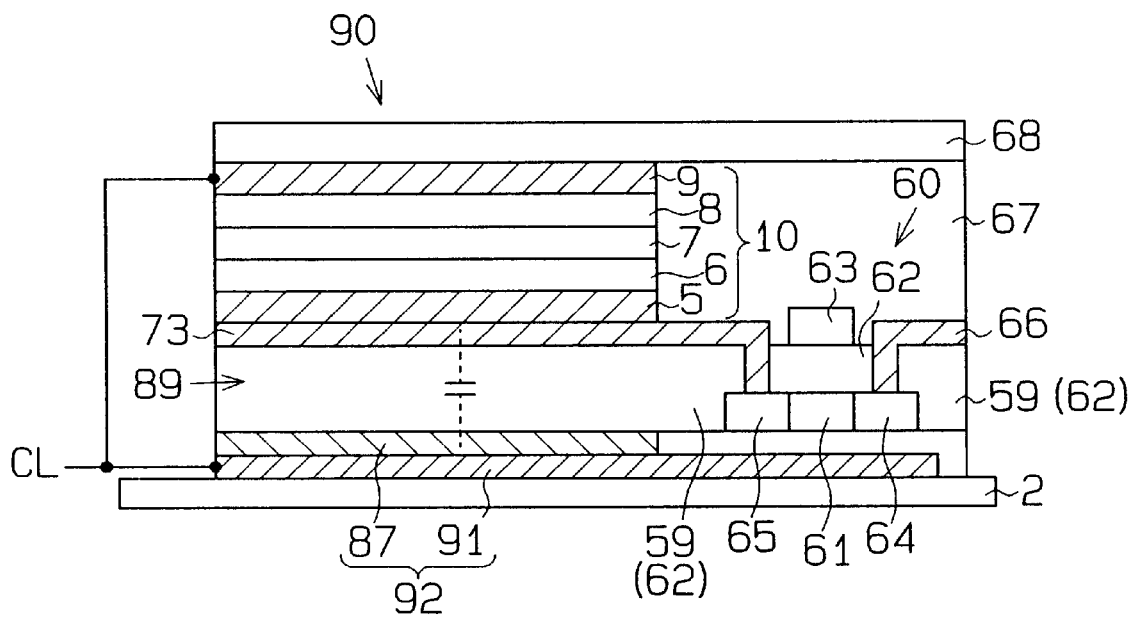
FIG. 18 is a schematic cross-sectional view of one pixel in a display apparatus according to a tenth embodiment of the present invention.

A display apparatus according to a tenth embodiment of the present invention will be described below with reference to the accompanying drawings. FIG. 18 is a schematic cross-sectional view of one pixel 90 in an organic EL display apparatus of an active matrix system according to the tenth embodiment.

The pixel 90 includes an organic EL element 10 and an added capacitor 89. A TFT 60 is provided as a pixel driving element. In the tenth embodiment, an $N^+$ type polycrystalline silicon film 91 of an added resistor 92 is formed to extend below the TFT 60. When low-cost glass is used for a transparent insulator substrate 2, therefore, the $N^+$ type polycrystalline silicon film 91 blocks the influence of ions contained in the glass, such as sodium ions or potassium ions, on the TFT 60. Preventing such ion influence ensures the stable operation of the pixel 90, thus improving the reliability of the pixel 90. The remaining structure of the pixel 90 is the same as that of the pixel 85 of the ninth embodiment.

Figure 19A:
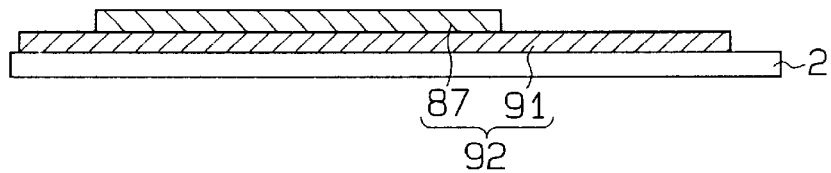
FIGS. 19A through 19D illustrate fabrication steps for the pixel of FIG. 18.

A preferred method of fabricating the pixel 90 will now be discussed. As shown in FIG. 19A, the $N^+$ type polycrystalline silicon film 91 is preferably formed to be about 500 Å thick on the transparent insulator substrate 2 of glass. Next, a $P^+$ type polycrystalline silicon film 87 having a thickness of about 500 Å is formed in an area on the $N^+$ type polycrystalline silicon film 91 where an added capacitor is to be formed. As a result, the added resistor 92 comprised of the $N^+$ type polycrystalline silicon film 91 and $P^+$ type polycrystalline silicon film 87 is formed.

Figure 19B:
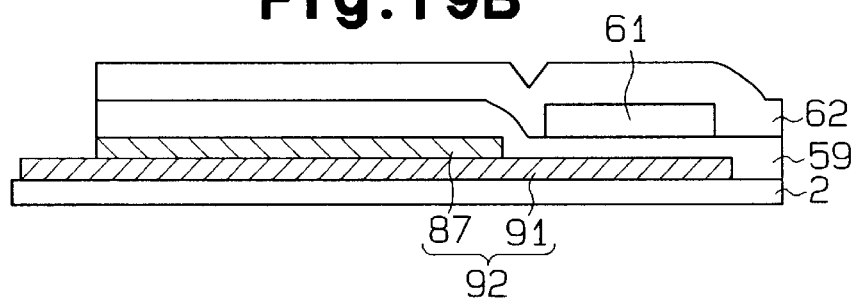

Then, the transparent insulator film 59 of, for example, silicon oxide is formed on the added resistor 92 as shown in FIG. 19B. A polycrystalline silicon film 61, which becomes an active layer of the TFT, is formed on the transparent insulator film 59. The area where the polycrystalline silicon film 61 is formed is different from the area where the $P^+$ type polycrystalline silicon film 87 is formed. A transparent insulator film 62 of, for example, silicon oxide is formed on the transparent insulator film 59 to cover the polycrystalline silicon film 61.

Figure 19C:
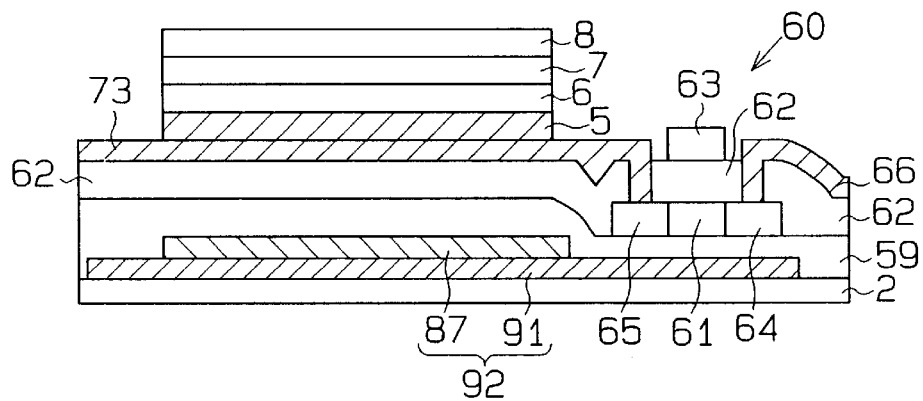

Next, a gate electrode 63 is formed on the transparent insulator film 62, as shown in FIG. 19C. With the gate electrode 63 as a mask, a high-concentration P type impurity is injected in the surface of the polycrystalline silicon film 61, which forms a drain region 64 and a source region 65. Then, an electrode 73 and a drain electrode 66, both of aluminum or ITO, are formed on the transparent insulator film 62. The electrode 73 and the source region 65 are connected together by a contact hole, and the drain electrode 66 and the drain region 64 are connected by another contact hole. The anode 5, the hole transporting layer 6, the luminous layer 7 and the electron transporting layer 8 are sequentially formed on the electrode 73 in a known manner.

Figure 19D:
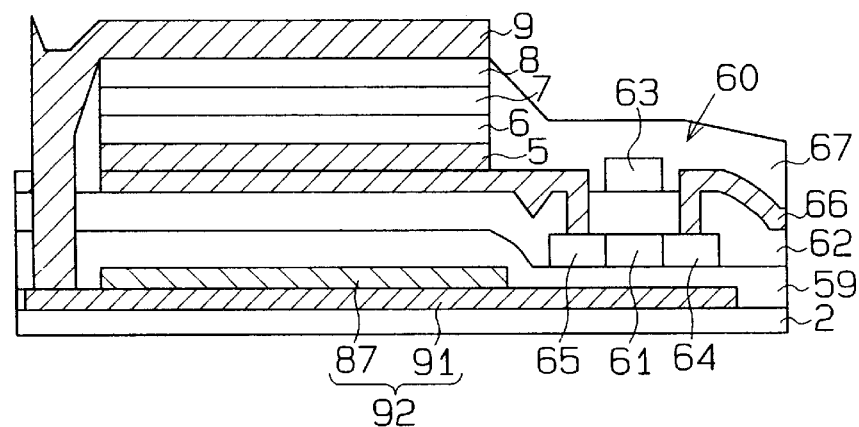

Next, as shown in FIG. 19D, an insulator film 67 is formed to cover the TFT 60, and the cathode 9 is formed of ITO on the electron transporting layer 8. The cathode 9 and the $N^+$ type polycrystalline silicon film 91 are connected together by a contact hole. Then, a passivation film (see FIG. 18) is formed to cover the cathode 9 of the organic EL element 10 and the TFT 60, thus yielding the pixel 90.

Figure 20A:
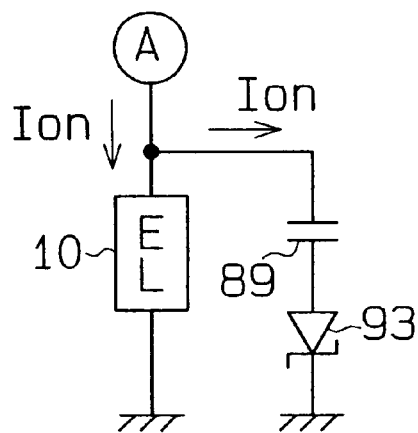
FIGS. 20A and 20B are schematic diagrams showing equivalent circuits of the pixel of FIG. 18 including resistor.
Figure 20B:
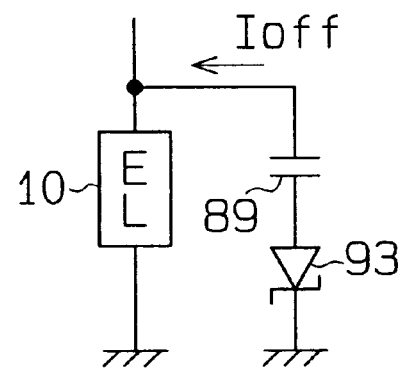
Figure 21:
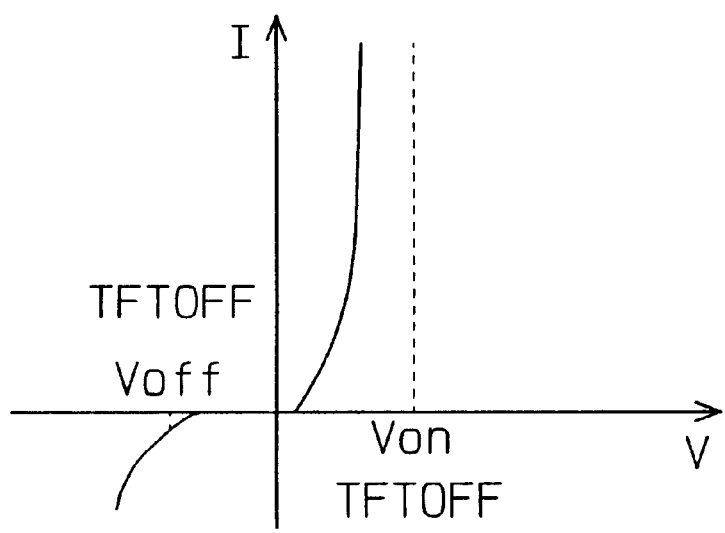
FIG. 21 is a characteristic graph for the added resistor of FIGS. 20A–20B.

When the concentration of the P type impurity in the $P^+$ type polycrystalline silicon film 87 and the concentration of the N type impurity in the $N^+$ type polycrystalline silicon film 91 are set equal to or greater than about $1 \times 10^{18}/cm^3$ in the tenth embodiment, the added resistor 92 functions as a Zener diode, which shows the reverse characteristic at a voltage Voff of about 5 V, as shown in FIG. 21. FIGS. 20A and 20B show an equivalent circuit of the pixel 90 including a Zener diode 93.

When the TFT 60 is turned on, the current Ion flows through the organic EL element 10 and the added capacitor 89, as shown in FIG. 20A. At this time, the Zener diode 93 functions as a low-resistance resistor due to the forward bias. The added capacitor 89 is therefore charged.

When the TFT 60 is turned off, the current Ioff flows toward the organic EL element 10 from the added capacitor 89, as shown in FIG. 20B. At this time, the Zener diode 93 functions as a high-resistance resistor due to the reverse bias. Therefore, the current Ioff is limited to a smaller value by the resistance of the Zener diode 93, which allows the light emission time of the organic EL element to be maintained for a relatively long period of time.

Figure 22A:
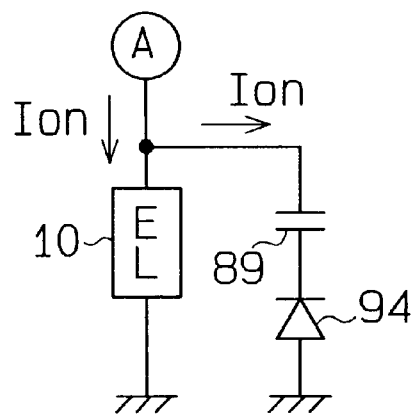
FIGS. 22A and 22B are schematic diagrams showing equivalent circuits of the pixel of FIG. 18 which has a further added resistor.
Figure 22B:
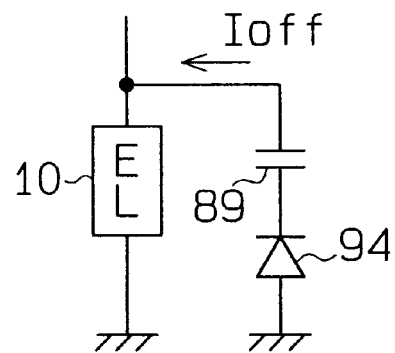
Figure 23:
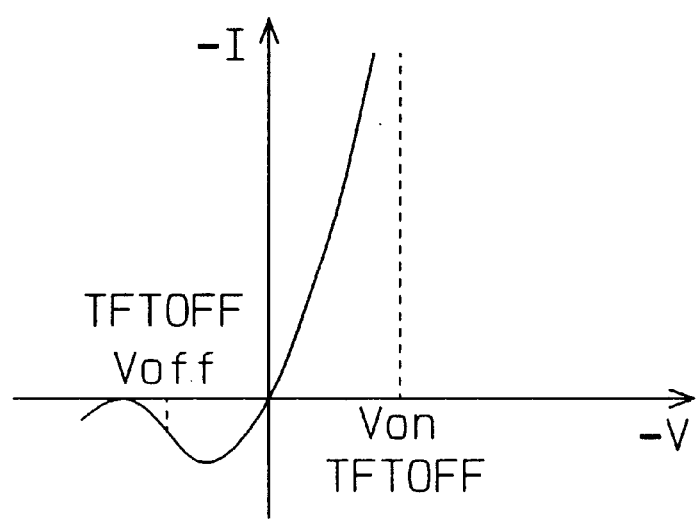
FIG. 23 is a characteristic graph for the further added resistor of FIGS. 22A–22B.

When the concentration of the P type impurity in the $P^+$ type polycrystalline silicon film 87 and the concentration of the N type impurity in the $N^+$ type polycrystalline silicon film 91 are set equal to or greater than approximately $3 \times 10^{19}/cm^3$, the added resistor 92 serves as a tunnel diode which has a tunnel effect, as shown in FIG. 23. The tunnel diode normally permits the reverse current to flow. Such an arrangement of the silicon films, however, causes the reverse current to flow when the TFT 60 is turned off. When the added resistor 92 functions as a tunnel diode, therefore, the arrangement of the silicon films should be reversed. Specifically, in FIG. 18, the $P^+$ type polycrystalline silicon film 87 is formed on the transparent insulator substrate 2 first, and an $N^+$ type polycrystalline silicon film is then formed on the $P^+$ type polycrystalline silicon film 87. The $P^+$ type polycrystalline silicon film is connected to the common cathode line CL. FIGS. 22A and 22B show an equivalent circuit of a pixel having a tunnel diode 94.

When the TFT 60 is turned on, the current Ion, which is reverse to the tunnel diode 94, flows through the organic EL element 10 and the added capacitor 89, as shown in FIG. 22A. When the TFT 60 is turned off, the forward current flows to the tunnel diode 94 from the added capacitor 89, as shown in FIG. 22B. It is preferable to set the voltage Voff to a value corresponding to a middle value between the tunnel current and diffusion current, so that a constant forward current flows. This is preferred because the organic EL element 10 can be driven by the constant forward current.

Eleventh Embodiment

Figure 24:
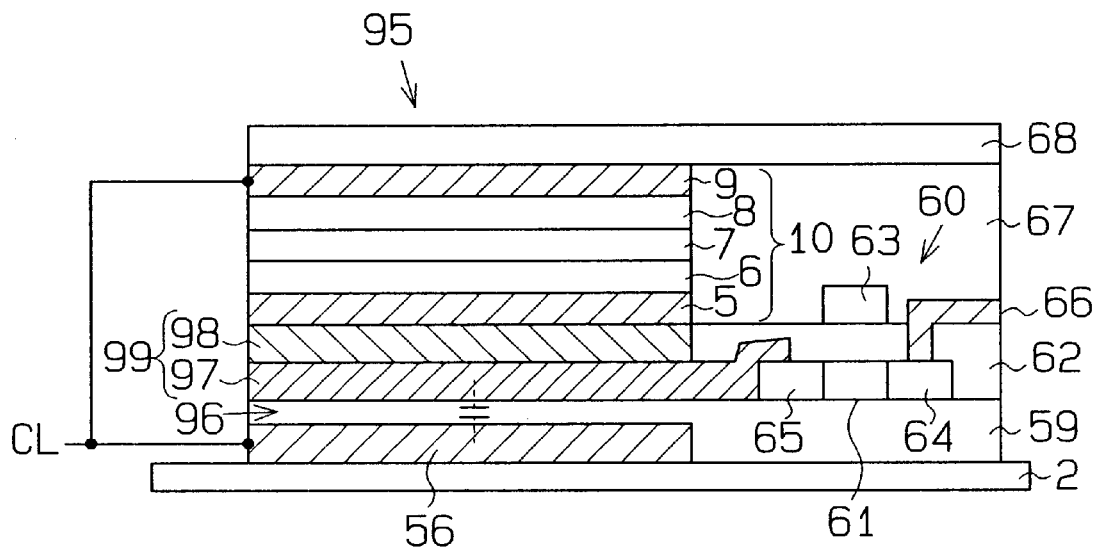
FIG. 24 is a schematic cross-sectional view of one pixel in a display apparatus according to an eleventh embodiment of the present invention.

A display apparatus according to an eleventh embodiment of the present invention will now be described with reference to the accompanying drawings. FIG. 24 is a schematic cross-sectional view of one pixel 95 in an organic EL display apparatus of an active matrix system according to the eleventh embodiment.

The pixel 95 includes an organic EL element 10, an added capacitor 96 and an added resistor 99. A TFT 60 is provided as a pixel driving element. An electrode 56, a transparent insulator film 59, the added resistor 99 and the organic EL element 10 are preferably laminated on a transparent insulator substrate 2 in the named order. The electrode 56 serves as the first electrode of the added capacitor (auxiliary capacitor) 96.

The added resistor 99 comprises a variable resistor, which includes an N$^+$ type polycrystalline silicon film 97 formed on the transparent insulator film 59, and a P$^+$ type polycrystalline silicon film 98 located on the silicon film 97. The electrode 56 and the added resistor 99 face each other with the transparent insulator film 59 located therebetween. The transparent insulator film 59 thus serves as a dielectric film. The transparent insulator film 59, the electrode 56, and the added resistor 99 form a capacitor or the added capacitor 96.

The N$^+$ type polycrystalline silicon film 97 preferably extends along the surface of the transparent insulator film 59 and is connected to the source region 65 of the TFT 60. Since, the anode 5 of the organic EL element 10 is in contact with the added resistor 99, the anode 5 serves as the source electrode of the TFT 60.

Figure 25:
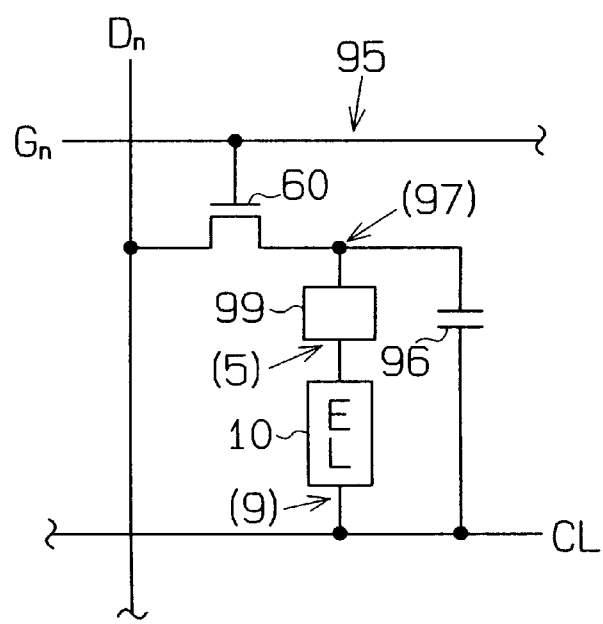
FIG. 25 is a diagram showing an equivalent circuit of the pixel in FIG. 24.

FIG. 25 is an equivalent circuit diagram of the pixel 95. The organic EL element 10 is connected via the added resistor 99 to the TFT 60. The added capacitor 96 is connected between the TFT 60 and a common cathode line CL. As show, the series circuit of the added resistor 99 and the organic EL element 10, is connected in parallel to the added capacitor 96, between the source region 65 of the TFT 60 and the common cathode line CL. The holding characteristic of the pixel 95 is improved by the capacitance of the added capacitor 96. The pixel 95 may be used to implements an organic EL display apparatus of an active matrix system which has a high image quality, while preventing the contrast of an image from getting lower.

According to the eleventh embodiment, when a positive voltage is applied to the gate line Gn, thus applying a positive voltage to the gate electrode 63 of the TFT 60, the TFT 60 is turned on. Consequently, the electrostatic capacitor of the organic EL element 10 and the added capacitor 96 are charged with the data signal applied to the drain line Dn, causing the data signal to be written in the pixel 95 with the organic EL element 10 being driven by the data signal.

When a negative voltage is applied to the gate line Gn, thus applying a negative voltage to the gate electrode 63 of the TFT 60, the TFT 60 is turned off. Then, the data signal is held in the form of charges by the electrostatic capacitor of the organic EL element 10 and the added capacitor 96. The organic EL element 10 is kept driven until the TFT 60 is turned on again.

Twelfth Embodiment

Figure 26:
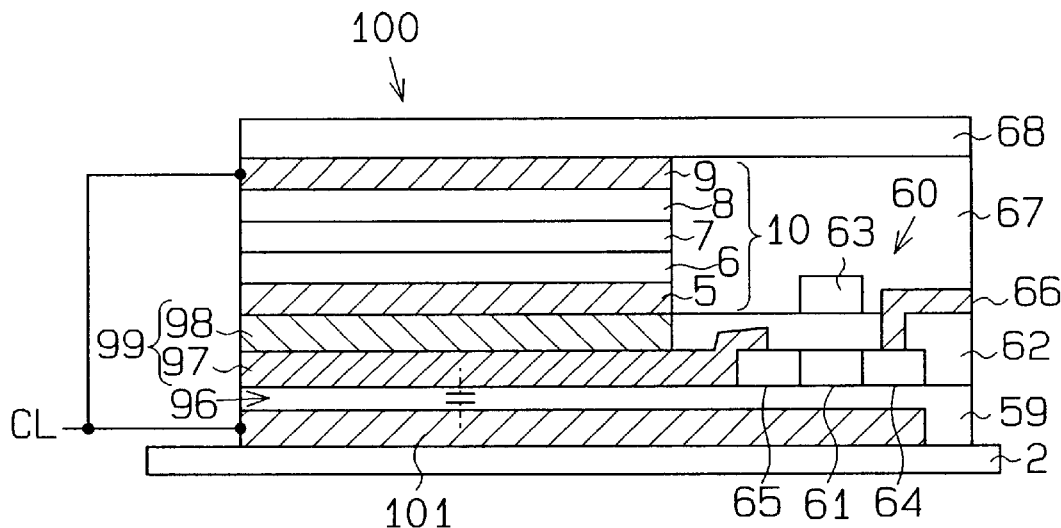
FIG. 26 is a schematic cross-sectional view of one pixel in a display apparatus according to a twelfth embodiment of the present invention.

A display apparatus according to a twelfth embodiment of the present invention will be described below with reference to the accompanying drawing. FIG. 26 is a schematic cross-sectional view of one pixel 100 in an organic EL display apparatus of an active matrix system according to the twelfth embodiment.

The pixel 100 includes an organic EL element 10 and an added capacitor 96. A TFT 60 is provided as a pixel driving element. In the twelfth embodiment, an electrode 101 is formed to extend below the TFT 60. The electrode 101 blocks the influence of ions such as sodium ions or potassium ions, contained in a transparent insulator substrate 2 made of glass, on the TFT 60. Preventing such ion influence ensures the stable operation of the pixel 100 and improves the reliability of the pixel 100. The remaining structure of the pixel 100 is the same as that of the pixel 95 of the eleventh embodiment.

Thirteenth Embodiment

Figure 27:
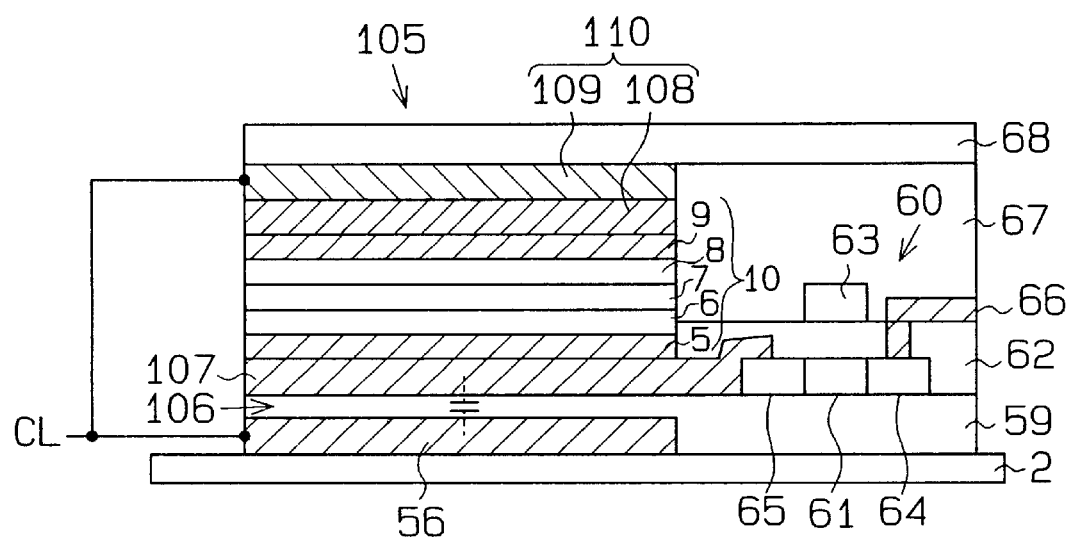
FIG. 27 is a schematic cross-sectional view of one pixel in a display apparatus according to a thirteenth embodiment of the present invention.

A display apparatus according to a thirteenth embodiment of the present invention will now be described with reference to the accompanying drawings. FIG. 27 is a schematic cross-sectional view of one pixel 105 in an organic EL display apparatus of an active matrix system according to the thirteenth embodiment.

The pixel 105 includes an organic EL element 10 and an added capacitor 106. A TFT 60 is provided as a pixel driving element. An electrode 56, a transparent insulator film 59, an electrode 107, the organic EL element 10 and an added resistor 110 are preferably laminated on a transparent insulator substrate 2 in the named order. The electrode 56 serves as the first electrode of the added capacitor (auxiliary capacitor) 106, and the electrode 107 serves as the second electrode of the added capacitor 106.

The added resistor 110 includes an N$^+$ type polycrystalline silicon film 108, formed on the cathode 9 of the organic EL element 10, and a P$^+$ type polycrystalline silicon film 109 formed on the silicon film 108, and operates as a variable resistor. The electrodes 56 and 107 face each other with the transparent insulator film 59 located therebetween. The transparent insulator film 59 thus serves as a dielectric film. The transparent insulator film 59 and the electrodes 56 and 107 form a capacitor or the added capacitor 106.

The electrode 107 extends along the surface of the transparent insulator film 59 and is connected to the source region 65 of the TFT 60. Since, the anode 5 of the organic EL element 10 is in contact with the electrode 107, the anode 5 serves as the source electrode of the TFT 60.

Figure 28:
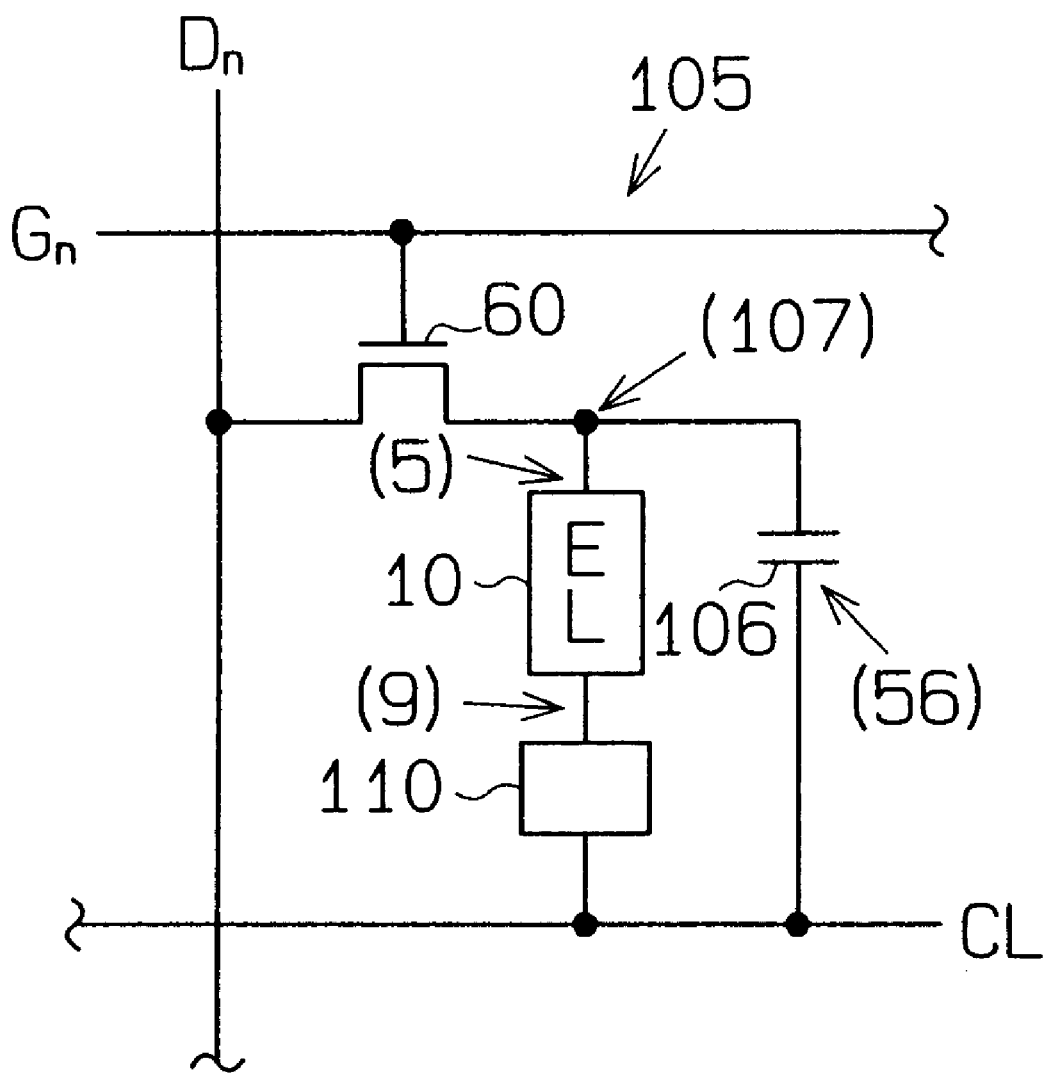
FIG. 28 is a diagram showing an equivalent circuit of the pixel in FIG. 27.

FIG. 28 is an equivalent circuit diagram of the pixel 105. The organic EL element 10 is connected via the added resistor 110 to a common cathode line CL. The added capacitor 106 is connected between the TFT 60 and the common cathode line CL. Specifically, the series circuit of the organic EL element 10 and the added resistor 110 is connected in parallel to the added capacitor 106, between the source region 65 of the TFT 60 and the common cathode line CL.

It should be apparent to those skilled in the art that the present invention may be embodied in many other specific forms without departing from the spirit or scope of the invention. For instance, the present invention may be adapted to an organic EL display apparatus which employs a transistor type or diode type of an active matrix system that uses bulk transistors as pixel driving elements. Diode type pixel driving elements include an MIM (Metal Insulator Metal) diode, ZnO (Zinc Oxide) varistor, MSI (Metal Semi-Insulator) diode, BTB (Back to Back) diode and RD (Ring Diode). The present invention may be adapted to a display apparatus which uses inorganic EL elements. Therefore, the present examples and embodiments are to be considered as illustrative and not restrictive and the invention is not to be limited to the details given herein, but may be modified within the scope and equivalence of the appended claims.

What is claimed is:

1. A display apparatus of a simple matrix system, comprising:
    a matrix of pixels, each pixel including:
        an electroluminescence element having a first electrode, a second electrode and a luminous element layer provided between said first electrode and said second electrode,
        an insulator film provided over one of said first electrode and said second electrode, and
        a third electrode provided in or over said insulator film so as to face one of said first electrode and said second electrode, said one of said first and second electrodes, said third electrode and said insulator film forming an added capacitor,
        wherein said added capacitor is connected in parallel to said electroluminescence element, and wherein each pixel includes an added resistor for restricting a current flowing in said electroluminescence element from said added capacitor.

2. The display apparatus according to claim 1, wherein said luminous element layer comprises an organic compound.

3. The display apparatus according to claim 1, wherein said luminous element layer includes a luminous layer and at least one of a hole transporting layer and an electron transporting layer, which is located over the luminous layer.

4. An improved display apparatus comprising:
    electroluminescence elements;
    added capacitors connected in parallel to each of said electroluminescence elements, respectively, and
    added resistors for restricting currents flowing in said electroluminescence elements from said added capacitors, respectively,
    wherein each of said added resistors comprises a variable resistor which has a high resistance when said each added capacitor is discharged.

5. An improved display apparatus comprising:
    electroluminescence elements;
    added capacitors connected in parallel to each of said electroluminescence elements, respectively, and
    added resistors for restricting currents flowing in said electroluminescence elements from said added capacitors, respectively, wherein each of said added resistors includes a P type impurity layer and an N type impurity layer connected to said P type impurity layer.

6. An improved display apparatus comprising:
    electroluminescence elements;
    added capacitors connected in parallel to each of said electroluminescence elements, respectively, and
    added resistors for restricting currents flowing in said electroluminescence elements from said added capacitors, respectively, wherein each of said added resistors is connected in series with each of said electroluminescence elements and each of said added capacitor is connected in parallel to the series circuit of said each electroluminescence element and said each added resistor.

7. An improved display apparatus comprising:
    electroluminescence elements;
    added capacitors connected in parallel to each of said electroluminescence elements, respectively, and
    added resistors for restricting currents flowing in said electroluminescence elements from said added capacitors, respectively, wherein each of said added resistors is connected in series with each of said electroluminescence elements and each of said added capacitor is connected in parallel to the series circuit of said each electroluminescence element and said each added resistor, and wherein each of said added resistors has a generally constant resistance.

8. An improved display apparatus comprising:
    electroluminescence elements;
    added capacitors connected in parallel to each of said electroluminescence elements, respectively, and
    added resistors for restricting currents flowing in said electroluminescence elements from said added capacitors, respectively, wherein each of said resistors is connected in series with each of said electroluminescence elements and each of said added capacitor is connected in parallel to the series circuit of said each electroluminescence element and said each added resistor, and wherein each of said added resistors comprises a variable resistor which has a high resistance when said each added capacitor is discharged.

9. An improved display apparatus comprising:
    electroluminescence elements;
    added capacitors connected in parallel to each of said electroluminescence elements, respectively, and
    added resistors for restricting currents flowing in said electroluminescence elements from said added capacitors, respectively, wherein each of said added resistors is connected in series with each of said electroluminescence elements and each of said added capacitor is connected in parallel to the series circuit of said each electroluminescence element and said each added resistor, and wherein each of said added resistors includes a P type impurity layer and an N type impurity layer connected to said P type impurity layer.

10. An improved display apparatus comprising:
    electroluminescence elements;
    added capacitors connected in parallel to each of said electroluminescence elements, respectively, and
    added resistors for restricting currents flowing in said electroluminescence elements from said added capacitors, respectively, wherein each of said added resistors is connected in series with each of said added capacitors, and each of said electroluminescence elements is connected in parallel to the series circuit of said each added capacitor and said each added resistor.

11. An improved display apparatus comprising:
    electroluminescence elements;
    added capacitors connected in parallel to each of said electroluminescence elements, respectively, and
    added resistors for restricting currents flowing in said electroluminescence elements from said added capacitors, respectively, wherein each of said added resistors is connected in series with each of said added capacitors, and each of said electroluminescence elements is connected in parallel to the series circuit of said each added capacitor and said each added resistor, and wherein each of said added resistors has a generally constant resistance.

12. An improved display apparatus comprising:
electroluminescence elements;
added capacitors connected in parallel to each of said electroluminescence elements, respectively, and
added resistors for restricting currents flowing, in said electroluminescence elements from said added capacitors, respectively, wherein each of said added resistors is connected in series with each of said added capacitors, and each of said electroluminescence elements is connected in parallel to the series circuit of said each added capacitor and said each added resistor, and wherein each of said added resistors comprises a variable resistor which has a high resistance when said each added capacitor is discharged.

13. An improved display apparatus comprising:
electroluminescence elements;
added capacitors connected in parallel to each of said electroluminescence elements, respectively, and
added resistors for restricting currents flowing in said electroluminescence elements from said added capacitors, respectively, wherein each of said added resistors is connected in series with each of said added capacitors, and each of said electroluminescence elements is connected in parallel to the series circuit of said each added capacitor and said each added resistor, and wherein each of said added resistors includes a P type impurity layer and an N type impurity layer connected to said P type impurity layer.

14. A display apparatus of an active matrix system, the apparatus comprising:
a matrix of pixels; and
driving elements, for driving the matrix of pixels, respectively, wherein the each pixel includes:
an electroluminescence element having a first electrode, a second electrode and a luminous element layer provided between said first electrode and said second electrode,
an insulator film provided over one of said first electrode and said second electrode, and
a third electrode provided in or over said insulator film so as to face one of said first electrode and said second electrode, one of said first and second electrodes, said third electrode and said insulator film forming an added capacitor, wherein said added capacitor is connected in parallel to said electroluminescence element, and wherein each pixel includes an added resistor for restricting a current flowing in said electroluminescence element from said added capacitor.

15. The display apparatus according to claim 14, wherein said driving element comprises a thin film transistor.

16. The display apparatus according to claim 14, wherein said luminous element layer comprises an organic compound.

17. The display apparatus according to claim 14, wherein said luminous element layer includes a luminous layer and at least one of a hole transporting layer and an electron transporting layer, which is located over the luminous layer.

18. The display apparatus according to claim 14, wherein said added resistor has a generally constant resistance.

19. The display apparatus according to claim 14, wherein said added resistor comprises a variable resistor which has a high resistance when said added capacitor is discharged.

20. The display apparatus according to claim 14, wherein said added resistor includes a P type impurity layer and an N type impurity layer connected to said P type impurity layer.

21. The display apparatus according to claim 14, wherein said added resistor is connected in series to said electroluminescence element and said added capacitor is connected in parallel to the series circuit of said electroluminescence element and said added resistor.

22. The display apparatus according to claim 21, wherein said added resistor has a generally constant resistance.

23. The display apparatus according to claim 21, wherein said added resistor comprises a variable resistor which has a high resistance when said added capacitor is discharged.

24. The display apparatus according to claim 21, wherein said added resistor includes a P type impurity layer and an N type impurity layer connected to said P type impurity layer.

25. The display apparatus according to claim 14, wherein said added resistor is connected in series to said added capacitor, and said electroluminescence element is connected in parallel to the series circuit of said added capacitor and said added resistor.

26. The display apparatus according to claim 25, wherein said added resistor has a generally constant resistance.

27. The display apparatus according to claim 25, wherein said added resistor comprises a variable resistor which has a high resistance when said added capacitor is discharged.

28. The display apparatus according to claim 25, wherein said added resistor includes a P type impurity layer and an N type impurity layer connected to said P type impurity layer.

29. A pixel for use in a matrix of pixels of a display apparatus, the pixel comprising:
an electroluminescence (EL) element having a first electrode, a second electrode and a luminous element layer disposed between the first and second electrodes;
an insulator disposed over the first electrode;
a third electrode provided in or over the insulator so as to face the first electrode, wherein the first electrodes, said third electrode and said insulator film form an added capacitor, and
an added resistor disposed over the second electrode for restricting a current flowing in said electroluminescence element from said added capacitor.

30. A pixel of an organic EL display apparatus, the pixel comprising:
an organic EL element;
an added capacitor connected in parallel to the EL element, and
an added resistor connected in series with the EL element, such that the EL element and the added resistor are connected in parallel with the added capacitor.

31. The pixel of claim 30, wherein the organic EL element comprises:
an anode;
a hole transporting layer disposed on a surface of an anode;
a luminous layer disposed on a surface the hole transporting layer;
an electron transporting layer disposed on a surface of the luminous layer; and
a cathode disposed on the electron transporting layer.

* * * * *